US012660228B2

(12) United States Patent
Romanczyk et al.

(10) Patent No.: US 12,660,228 B2
(45) Date of Patent: Jun. 16, 2026

(54) APPROACH TO CONTROLLING LINEARITY IN N-POLAR GaN MISHEMTS

(71) Applicant: The Regents of the University of California, Oakland, CA (US)

(72) Inventors: Brian Romanczyk, Santa Barbara, CA (US); Umesh K. Mishra, Montecito, CA (US); Pawana Shrestha, Goleta, CA (US); Matthew Guidry, Goleta, CA (US); James Buckwalter, Pasadena, CA (US); Stacia Keller, Santa Barbara, CA (US); Rohit Reddy Karnaty, Goleta, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 828 days.

(21) Appl. No.: 17/353,665

(22) Filed: Jun. 21, 2021

(65) Prior Publication Data

US 2021/0399121 A1 Dec. 23, 2021

Related U.S. Application Data

(60) Provisional application No. 63/040,706, filed on Jun. 18, 2020.

(51) Int. Cl.
 *H01L 29/66* (2006.01)
 *H10D 30/01* (2025.01)
 (Continued)

(52) U.S. Cl.
 CPC ......... *H10D 30/475* (2025.01); *H10D 30/015* (2025.01); *H10D 62/17* (2025.01);
 (Continued)

(58) Field of Classification Search
 CPC ......... H01L 29/66431; H01L 29/66462; H01L 29/778–7789; H01L 29/122–127; H01L 29/15–158
 See application file for complete search history.

(56) References Cited

U.S. PATENT DOCUMENTS 7,709,859 B2 * 5/2010 Smith .................. H01L 21/318
 438/167
2016/0149074 A1 * 5/2016 Atanackovic ..... H01L 21/02507
 438/45
(Continued)

OTHER PUBLICATIONS

Aparin et al., "Modified derivative superposition method for linearizing FET low-noise amplifiers," IEEE Transactions on Microwave Theory and Techniques, vol. 53, No. 2, pp. 571-581, 2005.
(Continued)

*Primary Examiner* — Chad M Dicke
*Assistant Examiner* — Valerie N Newton
(74) *Attorney, Agent, or Firm* — GATES & COOPER LLP

(57) ABSTRACT

Derivative cancellation techniques have been used to linearize transistors using multiple discreet devices. However at frequencies approaching and in the mm-wave regime the use of individual devices no longer works due to the parasitics associated with combining the devices. In this invention device structures are described which apply the derivative cancellation technique in a single device thus removing the detrimental impact of combining. In one example, an N-polar transistor structure includes a channel; a cap structure comprising a plurality of cap layers on or above the channel; a source contact and a drain contact to the channel; and a castellated, stepped, or varying pattern formed in the cap layers so that gate metal deposited on the
(Continued)

pattern forms at least two different threshold voltages and current combines in the ohmic region with essentially zero parasitic inductance.

18 Claims, 16 Drawing Sheets

(51) Int. Cl.

| | |
|---|---|
| *H10D 30/47* | (2025.01) |
| *H10D 62/17* | (2025.01) |
| *H10D 62/82* | (2025.01) |
| *H10D 62/824* | (2025.01) |
| *H10D 64/27* | (2025.01) |
| *H10D 99/00* | (2025.01) |
| *H10D 62/85* | (2025.01) |

(52) U.S. Cl.
CPC ........... *H10D 62/82* (2025.01); *H10D 62/824* (2025.01); *H10D 64/513* (2025.01); *H10D 99/00* (2025.01); *H10D 62/8503* (2025.01)

(56) References Cited

U.S. PATENT DOCUMENTS

| | | | |
|---|---|---|---|
| 2019/0051732 A1* | 2/2019 | Stoffels | H01L 29/2003 |
| 2019/0115462 A1* | 4/2019 | Teo | H01L 29/1029 |
| 2019/0259866 A1* | 8/2019 | Teo | H01L 29/7785 |

OTHER PUBLICATIONS

Fang et al., "Effect of Optical Phonon Scattering on the Performance of GaN Transistors". IEEE Electron Device Letters, vol. 33, No. 5, pp. 709-711, 2012.

Guidry et al., "Demonstration of 30 GHz OIP3/PDC > 10 dB by mm-wave N-polar Deep Recess MISHEMTs," in 14th European Microwave Integrated Circuits Conference (EuMIC), Paris, 2019, pp. 64-67.

Joglekar et al., "Large Signal Linearity Enhancement of AlGaN/GaN High Electron Mobility Transistors by Device-level VT Engineering for Transconductance Compensation," in IEEE International Electron Devices Meeting (IEDM), 2017, pp. 613-616.

Maas et al., "Modeling the Gate I / V Characteristic of a GaAs MESFET for Volterra-Series Analysis," IEEE Trans. Microw. Theory Tech., vol. 37, No. 7, pp. 1134-1136, 1989.

Mi et al., "Improving the transconductance flatness of InAlN/GaN HEMT by modulating VT," Applied Physics Express, vol. 12, No. 11, 2019, pp. 114001-1 to 114001-5.

Moon et al., "Novel High-speed Linear GaN Technology with High Efficiency," in IEEE MTT-S International Microwave Symposium (IMS), Boston, 2019, pp. 1131-1132.

Sohel et al., "Linearity Improvement with AlGaN Polarization—Graded Field Effect Transistors with Low Pressure Chemical Vapor Deposition Grown SiNx Passivation," IEEE Electron Device Letters, vol. 41, No. 1, Jan. 2020, pp. 19-22.

S. A. Maas, "Nonlinear Microwave and RF Circuits". Artech House, 1997, 604 pages.

Keller, S., et al., "GaN RF transistors 2.0?", compoundsemiconductor.net, 2023, pp. 22-25, Issue VII.

* cited by examiner $$\text{ProbabilityDensity}(V_T) = \frac{1}{\sqrt{(2\pi\sigma^2)}} \, e^{-\left(\frac{V_T - V_{t,designed}}{2\sigma^2}\right)}$$

APPROACH TO CONTROLLING LINEARITY IN N-POLAR GaN MISHEMTS

CROSS REFERENCE TO RELATED APPLICATIONS

This application claims the benefit under 35 U.S.C. Section 119(e) of co-pending and commonly-assigned U.S. provisional patent application Ser. No. 63/040,706, filed on Jun. 18, 2020, by Brian Romanczyk, Umesh K. Mishra, Pawana Shrestha, and Matthew Guidry, entitled "NOVEL APPROACH TO CONTROLLING LINEARITY IN N-PO-LAR GAN MISHEMTS," which application is incorporated by reference herein.

STATEMENT REGARDING FEDERALLY SPONSORED RESEARCH AND DEVELOPMENT

This invention was made with Government support under Grant (or Contract) No. N00014-18-1-2049, awarded by the United States Office of Naval Research. The Government has certain rights in this invention.

BACKGROUND OF THE INVENTION

1. Field of the Invention

The present disclosure relates to N-Polar III-nitride devices and methods of making the same.

2. Description of the Related Art (Note: This application references a number of different references as indicated throughout the specification by one or more reference numbers in superscripts, e.g., [x]. A list of these different publications ordered according to these reference numbers can be found below in the section entitled "References." Each of these publications is incorporated by reference herein.

SUMMARY OF THE INVENTION

Derivative cancellation techniques have been used to linearize transistors using multiple discrete devices. However at frequencies approaching and in the mm-wave regime, the use of individual devices has reduced effectiveness due to the parasitics associated with combining the devices. The present disclosure describes device structures which apply the derivative cancellation technique in a single device, thus removing the detrimental impact of combining.

Example embodiments of the present invention include, but are not limited to, the following.

1. A device, comprising:

a transistor structure comprising:

a source;

a drain;

a channel comprising a material;

a gate modulating a flow of current comprising mobile charge carriers between the source and the drain, the gate having a gate width having a component parallel to a direction perpendicular to the flow; and a thickness comprising one or more materials between the gate and a centroid of the mobile charge carriers, wherein at least 50% of the thickness is comprised of the same material as the channel and the thickness varies along the gate width so as to vary a threshold voltage along the gate width.

2. The device of clause 1, comprising at least one of:

the thickness varying discretely in sections of the gate width so that each of a plurality of portions of current flowing under a different one of the sections experience a different discrete threshold voltage and a longest one of the sections of a particular threshold voltage has a length no more than 0.1% of a free space wavelength of a maximum operating frequency of the transistor, so as to reduce a parasitic inductance between the portions of current, or the thickness varying continuously to continuously vary the threshold voltage and a distance between repeated threshold voltages is no more than 0.1% of the free space wavelength so as to reduce the parasitic inductance between the portions of current.

3. The device of clause 1, wherein:

the transistor has at least one of $g_{m2}$ and $g_{m3}$ tailored by a variation in the threshold voltage across the gate width;

the thickness has two values, thereby setting two threshold voltages, which are selected in such a way that at least:

the $g_{m2}$ associated with each of the threshold voltages have opposite signs and magnitudes equal to within 50% over a range in gate voltages applied to the gate with respect to the channel, the $g_{m3}$ associated with each of the threshold voltages have opposite signs and magnitudes equal to within 50% over the range in gate voltages, such that a summing of portions of the current in individual sections of the gate width experiencing the different ones of the two threshold voltages reduces the magnitude of at least one of $g_{m2}$ or $g_{m3}$ over the range in the gate voltages relative to a constituent single-threshold voltage transistor having only one of the two threshold voltages.

4. The device of clause 1, wherein:

the transistor has at least one of $g_{m2}$ and $g_{m3}$ tailored by a variation in the threshold voltage;

the thickness varies with more than two values, varies in a continuous fashion across the gate width, or has a combination of discrete and continuously varying values, so as to set a plurality of threshold voltages, such that a summing of portions of the current, flowing in individual sections of the gate width experiencing different ones of the threshold voltages, reduces a magnitude of $g_{m2}$ Or $g_{m3}$ over a range in gate voltage, relative to a constituent single-threshold voltage transistor comprising only one of the threshold voltages.

5. The device of clause 1, wherein:

the materials and a total separation between the gate and the centroid lead to a planar mobile carrier charge density, of the mobile charge carriers underneath the gate at zero gate to source voltage, that at least:

varies by no more than 20% across an active width of the gate;

or, has a minimum value of $0.9 \cdot 10^{13}$ cm$^{-2}$ assessed in any segment 50 nanometers or wider across the active width of the gate; and the active width of the gate includes portions of the gate which are above a conducting channel comprising the mobile charge carriers, and does not include edge regions where isolation processes may alter channel charge densities.

3

6. A transistor, comprising:
a channel comprising a III-nitride material comprising a crystal having a surface comprising a Nitrogen-polar plane of the crystal, or a plane within 10 degrees of the Nitrogen-polar plane;
a source contact and a drain contact to the channel;
a III-nitride backbarrier confining mobile charge carriers in the channel;
a III-nitride cap, wherein the channel is between the cap and the backbarrier;
a recess or opening in the cap;
a gate in the recess, the gate controlling a flow of current between the source contact and the drain contact and the gate having a gate width having a component parallel to a direction perpendicular to the flow;
and wherein:
the gate is closer to the Nitrogen-polar plane or the plane within 10 degrees of the Nitrogen-polar plane, as compared to a metal-polar plane of the crystal; and
the recess comprises a depth varying along the gate width so that the transistor has at least two threshold voltages varying along the gate width.
7. The device of clause 6 wherein the recess at least:
extends into the channel across at least a portion of the gate width, or
includes an electrically insulating material deposited on a base, sidewalls, or the base and sidewalls of the recess.
8. The device of clause 6 wherein at least 50% of a thickness between the gate and a centroid of the mobile charge carriers, including the cap and the channel, consists essentially of the III-nitride material of the channel across an entirety of the gate width.
9. The device of clause 6 wherein a plurality of distances between the gate and the centroid of the mobile charge carriers in the channel tailor a linearity or nonlinearity of the device.
10. The device of clause 6, wherein:
the III-nitride material comprises one or more layers of $Sc_vGa_wAl_xIn_yB_zN$ where $0 \leq v \leq 1$, $0 \leq w \leq 1$, $0 \leq x \leq 1$, $0 \leq y \leq 1$, $0 \leq z \leq 1$, and $v+w+x+y+z=1$ and at least 50% of a thickness between the gate and the centroid of the mobile charge carriers comprises one or more layers of the $Sc_vGa_wAl_xIn_yB_zN$ wherein the x, y, z, v, w do not vary by more than 5% as compared to in the channel, or
the channel comprises a composition including Gallium and Nitrogen, and at least 50% of the thickness consists essentially of the composition or GaN.
11. The device of clause 6 wherein the cap comprises a plurality of layers, including at least two etch stop layers, wherein the etch stop layers are used to control the depths defining a distance between the gate and a centroid of the mobile charge carriers.
12. The device of clause 9 wherein distances between the gate and the centroid of mobile charge carriers form different sections along the gate width that experience different threshold voltages, and the distances are selected such that a summing of portions of the current in the different sections of the gate width reduces a magnitude of at least one of $g_{m2}$ or $g_{m3}$ over a range in gate voltage relative to a constituent single-threshold voltage transistor having only one of the threshold voltages.
13. The device of clause 6, wherein:
the channel comprises GaN comprising a two dimensional electron gas or a two dimensional hole gas confined in the channel by the barrier;

the cap comprises a cap structure on the channel and the cap structure comprises the second material including:
a first aluminum containing nitride layer on or above the channel;
a first GaN layer on or above the first aluminum containing nitride layer;
a second aluminum containing nitride layer on or above the first GaN layer;
a second GaN layer on or above the second aluminum containing nitride layer,
the first and second aluminum containing nitride layers are etch stop layers,
a first region of the recess extends through the second GaN layer and the first GaN layer so that only a portion of the first aluminum containing nitride layer is between the channel and a base of the gate, or the recess extends all the way through the first aluminum containing nitride layer, and
a second region of the recess extends through second GaN layer and at least a portion of the second aluminum containing nitride layer, so that the first aluminum containing nitride layer and at least a portion of the first GaN layer are between the channel and the base of the gate.
14. The device of clause 6, wherein:
the cap includes two or more aluminum containing nitride layers,
the cap includes recess including two or more etched recesses, and
the aluminum containing nitride cap layers form epitaxially-defined etch stops establishing the depths controlling the threshold voltages.
15. The device of clause 14, wherein a percentage of the gate width occupied by each of the threshold voltages, and the depths of the recess, are such that a transconductance derivative local maximum for one or more of $g_{m2}$ Or $g_{m3}$, respectively, defined by one of the threshold voltages, are overlaid with a local derivative minimum of $g_{m2}$ Or $g_{m3}$ respectively, defined by another of the threshold voltages, with a magnitude equal to within 50% so as to reduce a sum of at least the $g_{m2}$ or the $g_{m3}$, respectively, compared to that of a device having a recess comprising only the largest of the depths.
16. The device of clause 6 operating a frequency greater than 1 GHz.
17. A method of making a transistor, comprising:
obtaining an N-polar III-Nitride structure comprising:
a III-nitride barrier layer on or above a substrate;
a III-nitride channel layer on the III-nitride barrier layer, wherein the barrier layer confines mobile charge carriers in the channel layer;
a III-nitride cap on the channel layer, wherein the III-nitride cap includes one or more etch stop layers separated by layers that etch at least 10 times faster than the etch stop layers;
etching a recess having a depth profile in the III-nitride cap layer using lithographic patterning;
forming a source contact and a drain contact to the channel layer;
depositing a gate in the recess so that the gate controls a flow of current between the source contact and the drain contact and the gate has a gate width having a component parallel to a direction perpendicular to the flow of the current; and wherein:
the lithographic patterning and a composition and positioning of the etch stop layers establish the depth profile varying along the gate width so that the transistor has at least two threshold voltages varying along the gate width.

18. The method of clause 1, wherein:

the channel layer comprises GaN and the mobile charge carriers comprise a two dimensional electron gas or a two dimensional hole gas;

the cap comprises:

a first one of the etch stop layers comprising a first nitride layer comprising aluminum on or above the channel;

a first GaN layer on or above the first nitride layer;

a second one of the etch stop layers comprising a second nitride layer comprising aluminum on or above the first GaN layer;

a second GaN layer on or above the second nitride layer, a first region of the recess extends through the second GaN layer, the second nitride layer, the first GaN layer, and the first nitride layer or so that only a portion of the first aluminum nitride layer is between the channel and a base of the gate, and a second region of the recess extends through second GaN layer and the second nitride layer, so that the first aluminum nitride layer and at least the first GaN layer is between the channel and the base of the gate.

BRIEF DESCRIPTION OF THE DRAWINGS

Referring now to the drawings in which like reference numbers represent corresponding parts throughout:

(FIG. 2B) Output and (FIG. 2C) transfer characteristics at a quiescent gate and drain bias ($V_{GS,Q}$; $V_{DS,Q}$) of (−6V; +7V). (FIG. 2D) Transconductance ($g_m$) and second and third IDS ($V_{GS}$) derivatives ($g_{m2}$, $g_{m3}$). $g_{m3}$ crosses zero at device turn-on ($V_{GS}$=−5.18V). This is where we expect a high linear response and a peak in the OIP3 and OIP3/$P_{DC}$ linearity metric.

(FIG. 3A) Small-Signal RF gain at $V_{DS, Q}$ of 5V and $V_{GS, Q}$ of −4V. The peak $f_T$ of the device is 138 GHz. The maximum stable gain (MSG) at 30 GHz is 13.6 dB. (FIG. 3B) Two-tone load-pull input-bias sweep at 30 GHz with a tone-spacing of 1 MHz. The red curve is the initial coarse sweep and the blue curve is taken with finer Vos steps to capture the OIP3/$P_{DC}$ peak. OIP3/$P_{DC}$ peaks at $V_{GS}$=−5.1V, consistent with $g_{m3}$ zero-crossing. The sharp, narrow OIP3/$P_{DC}$ peak over a limited range of gate-bias means that linearity is sensitive to bias.

(FIG. 4A) Total output power in the fundamental tones (Pout), Upper (Hi) and Lower (Lo) intermodulation products ($P_{13,hi}$, $P_{13,lo}$), and corresponding OIP3 are shown. The device simultaneously exhibits a maximum OIP3 of 32 dBm and GT of 12.7 dB at total available input power of −12.1 dBm. (FIG. 4B) Linearity is reported in two different metrics. Carrier power to IM3 ratio (C/IM3) is better than 50 dBc for input powers less than-5 dBm. We note a maximum OIP3/$P_{DC}$ of 15 dB, which is an excellent linearity performance at 30 GHz, but is sensitive to gate bias.

FIG. 6A-6B illustrate examples of an entire gate width or a section of a gate width that can be periodically repeated or continued with varying width of the sections of $V_{T1}$ and $V_{T2}$. The first section or last section of the gate width can be $V_{T1}$ or $_{VT2}$ FIG. 7 Illustration of $3^{rd}$ derivative cancellation based on Angelov model showing (i) the constituent current of the sub-gate portions with threshold voltages $V_{T,A}$ and $V_{T,B}$, as well as the total composite current, (ii) the derivatives of the drain current, an (iii) resulting OIP3 to $P_{DC}$ ratio in dB FIG. 8A-8D. Dual threshold device plan view (FIG. 8A) and in cross-section (FIG. 8B-8C). In FIG. 8A, the sections 800 each represent a section of the gate and a region of the thickness under the gate that experience a particular threshold voltage $V_{T1}$ or $V_{T2}$.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

A. Introduction

It is important to enhance the linearity of transistors in communications systems. In particular third-order non-linearities result in in-band distortion and are therefore particularly important to control. Embodiments of the present invention utilize parallel derivative cancellation within a wide bandgap transistor to achieve high linearity.

Figure 1:
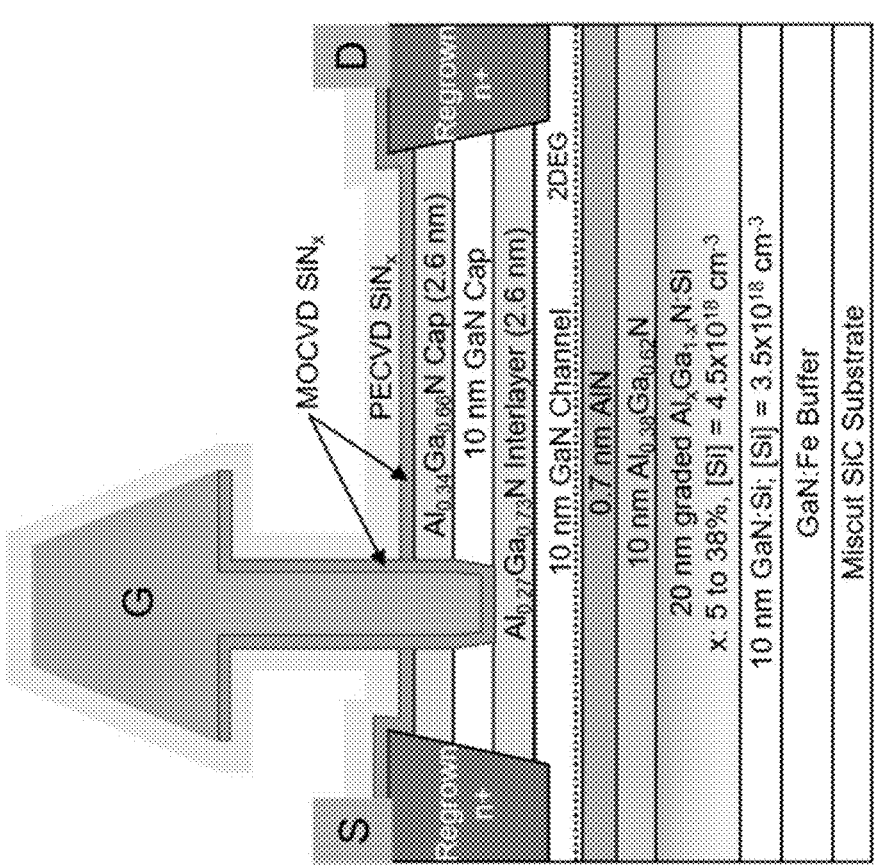
FIG. 1. A N-polar device used for establishing a baseline for a single-threshold voltage device.

The N-polar deep-recess HEMT shown in FIG. 1 is used as the canonical device to demonstrate the approach. Not all the layers are necessary for the device function but this device was used to establish a baseline for a single-threshold device and a design space for the approaches presented.

To aid the discussion, the following definitions of linearity metrics under two-tone stimulus are used:

1. IM3 is the power in the third-order intermodulation products (should be small).
2. C/IM3 is the ratio of the carrier power to IM3 (decreases with increasing carrier power).
3. Output-referred $3^{rd}$ order intercept point (OIP3) is the extrapolated output power at which the carrier power equals IM3 (should be large).
4. OIP3 normalized over dissipated DC power (OIP3/$P_{DC}$), a useful figure of merit to compare the linearity among different devices and bias conditions where power dissipation is important (should be high).

So far, solutions for high device-level linearity have been explored for Ga-polar GaN HEMTs; they include (i) HEMTs patterned with variable-width fins [1], (ii) InAlN/GaN HEMT with $V_T$ modulated along the gate-width [2], (ii) HEMTs with graded AlGaN/GaN channel and $SiN_x$ passivation reporting OIP3/$P_{DC}$ of 13.3 dB at 10 GHz [3], (iii) HEMTs with graded AlGaN/GaN channel, reporting C/IM3 of 30 dBc at 30 GHz (no OIP3/$P_{DC}$ available) [4].

Preliminary linearity data of a N-polar GaN MIS-HEMT has been reported by Guidry et al. with OIP3/$P_{DC}$ of up to 11.4 dB at 30 GHz [5]. The device structure in [5] is designed for power amplification. The baseline device structure is modified from the N-polar GaN MIS-HEMT in [5], and is able to simultaneously achieve high gain (12.7 dB) and excellent linearity performance (OIP3/$P_{DC}$ of 15 dB) at 30 GHz.

Transconductance and its derivatives dominate the intermodulation distortion and the linear response of the device [5, 6]. Using a power-series analysis for the non-linear IDS ($V_{GS}$) relationship, OIP3 can be calculated as [7]:

$$OIP3\ (dBm) = 10\log_{10}\left(\frac{2g_m^3}{3g_{m3}}R_{Load}\right) + 30 \qquad (1)$$

where the transconductance ($g_m$) is the first derivative of the IDs ($V_{GS}$) relationship, and $g_{m3}$ is the third IDs ($V_{GS}$) derivative. The baseline N-polar device was designed for high transconductance (high gain), while the biasing condition for two-tone load-pull measurement is selected to minimize $g_{m3}$ (maximize OIP3).

The sharp decrease in $g_m$ beyond the $g_m$ peak as the gate voltage is increased is common in GaN HEMTs [8]. In such cases, there are two bias conditions for high OIP3: (i) close to the $g_m$ peak, where several approaches, including but not limited to polarization engineering, are implemented aiming for a flat $g_m$ profile at the peak or a gradually dropping $g_m$ at higher gate-bias, and (ii) $g_{m3}$ zero-crossing point, where the device is turning on and the OIP3/$P_{DC}$ is expected to peak over a limited range of gate-bias. Since the baseline device is designed for low-power receiver application, we operate at the $g_{m3}$ zero-crossing point, where the current density (and therefore power dissipation) is low.

1. Pulsed I-V Characteristics

Figures 2A, 2B, 2C, 2D:
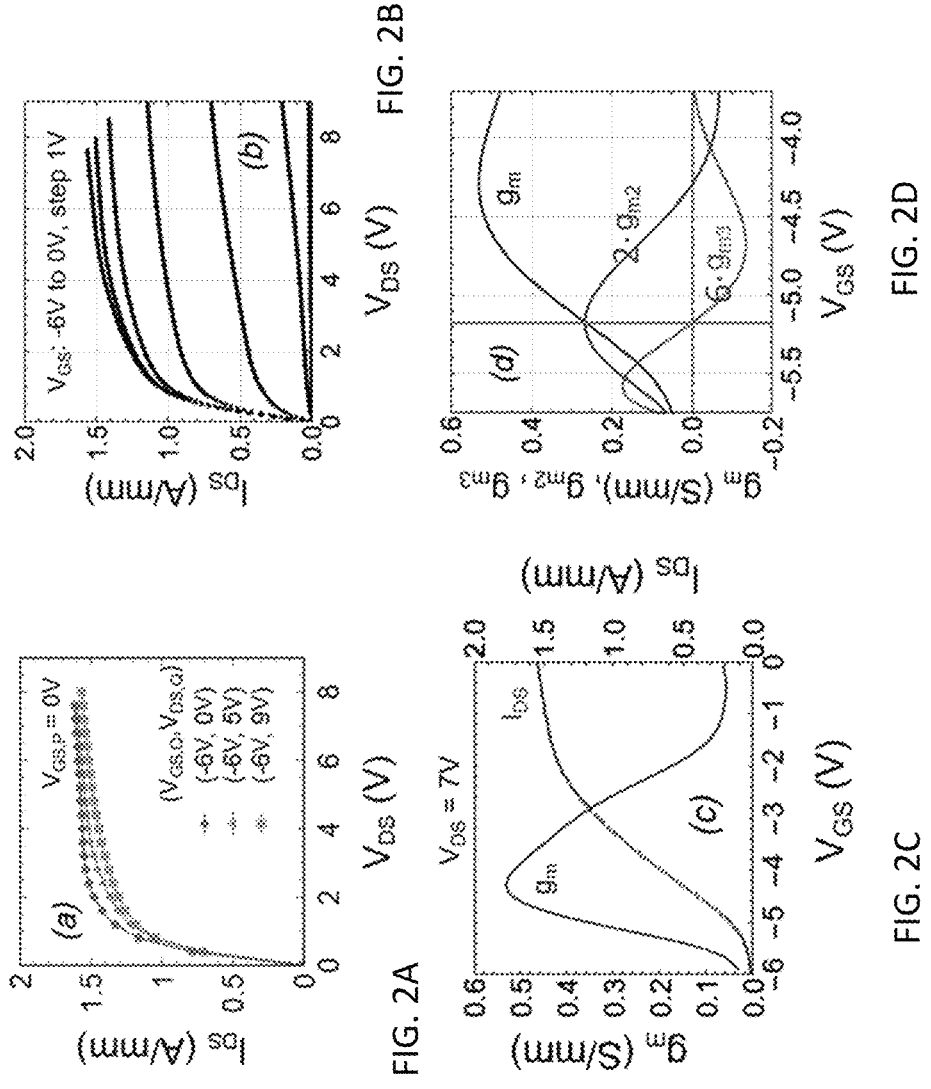
FIGS. 2A-2D. Pulsed I-V characteristics (FIG. 2A) Output characteristics with $V_{GS,Q}$=−6V, and drain stressed from 0V to 9V.

FIG. 2 shows the pulsed I-V transfer and output characteristics measured with a gate pulse-width of 1 μs and drain pulse-width of 800 ns. ~10% dispersion was observed in the device. FIG. 2 (*d*) shows $g_m$ and its derivatives ($g_{m2}$, $g_{m3}$). Note that $g_{m3}$ crosses zero at $V_{GS}$=−5.18V, where the device is turning on. According to (1), this $g_{m3}$ zero-crossing point is where we expect a high linear response and a peak in the OIP3 and OIP3/$P_{DC}$ linearity metric.

2. Small-Signal Performance

Figures 3A, 3B:
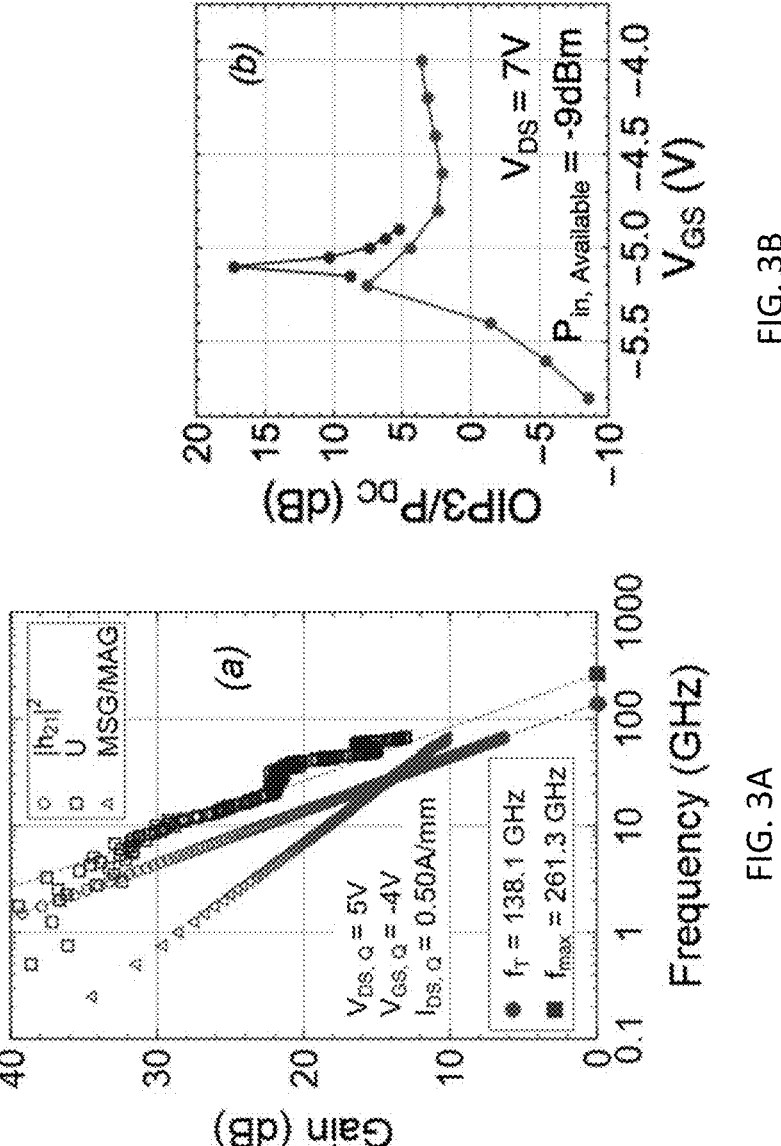
FIGS. 3A-3B.

The S-parameters were measured from 0.25 to 67 GHz with GSG probes calibrated by line-reflect-reflect-match (LRRM) method using an impedance standard substrate. On-wafer open and short structures were measured for de-embedding probe pads. The device demonstrates a peak $f_T$ of 138 GHz at a quiescent gate and drain bias ($V_{GS,Q}$; $V_{DS,Q}$) of (−4V; 5V) shown in FIG. 3 (*a*), and a peak fmax of 287 GHz at ($V_{GS,Q}$; $V_{DS,Q}$) of (−4.25V; 9V). At 30 GHz, the maximum stable gain (MSG) is 13.6 dB at the bias condition for peak $f_T$ (FIG. 3 (*a*)) and 14.8 dB for peak $f_{max}$ condition.

3. Linearity Performance

The linearity measurement is performed at 30 GHz with a tone-spacing of 1 MHz. The sharp, narrow peak of OIP3/$P_{DC}$ versus gate bias ($V_{GS}$) at $V_{GS}$=−5.1V is consistent with the $g_{m3}$ zero-crossing point in FIG. 2 (*d*). The fact that OIP3/$P_{DC}$ peaks over a limited range of gate-bias means that linearity is sensitive to bias. Generally, all transistors exhibit a $g_{m3}$ zero-crossing point and a corresponding OIP3/$P_{DC}$ peak at the device turn-on point.

Figures 4A, 4B:
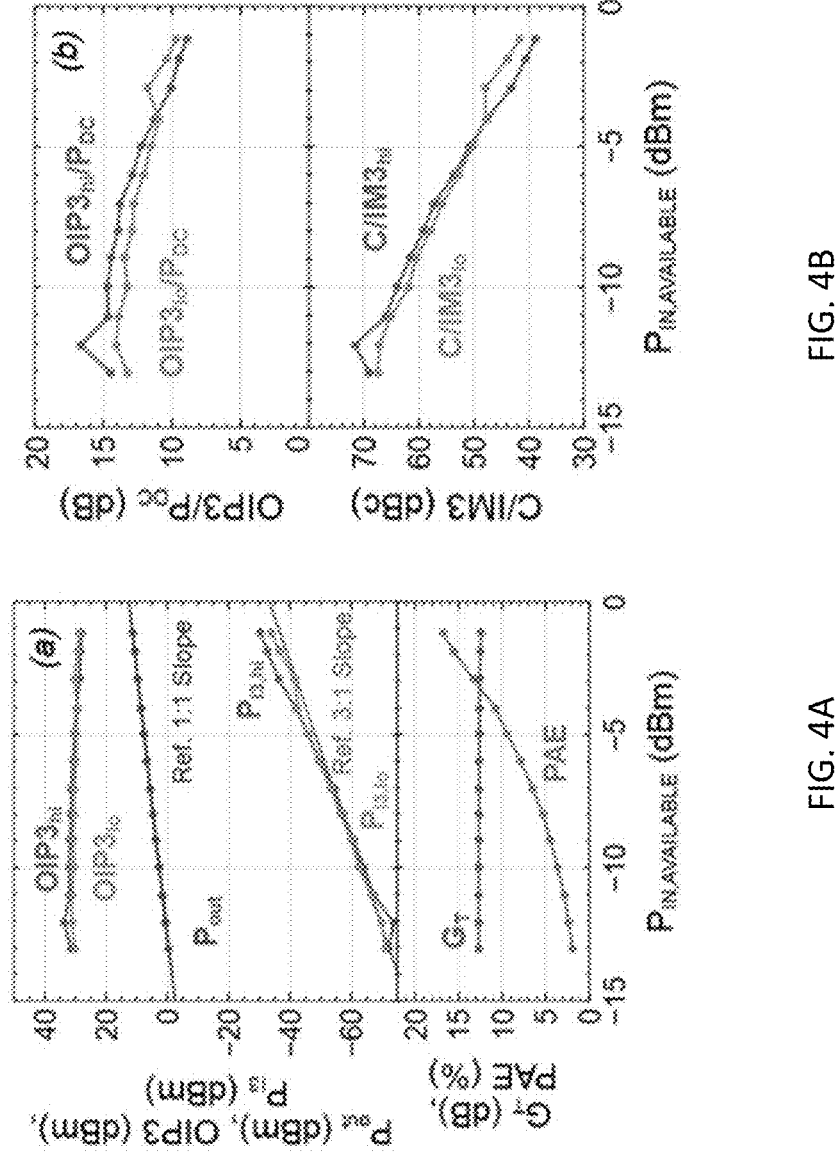
FIGS. 4A-4B Two-tone load-pull input-power sweep at 30 GHz with tone spacing of 1 MHz shown.

This device displays generation of low IM3, with C/IM3 better than 50 dBc for input powers less than-5 dBm (FIG. 4 (*b*)). The device simultaneously exhibits a maximum OIP3 of 32 dBm and transducer gain ($G_T$) of 12.7 dB at total available input power of −12.1 dBm. (FIG. 4 (*a*)).

A maximum OIP3/$P_{DC}$ of 15 dB (FIG. 4 (*b*)) is observed which is an excellent linearity performance at 30 GHz, but is sensitive to gate bias, resulting in susceptibility to process and temperature variations.

Figure 5:
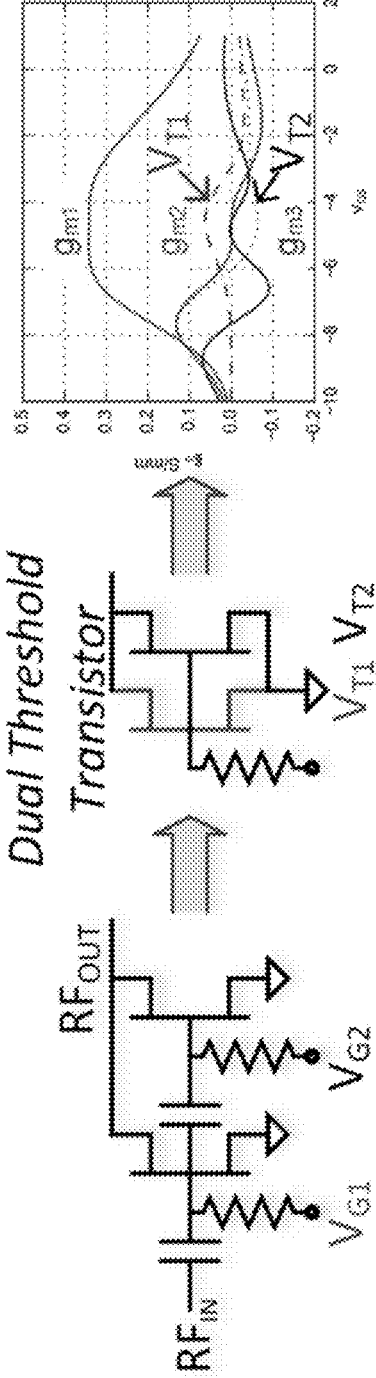
FIG. 5. Illustration of traditional derivative superposition using two gate voltage biases and the proposed threshold-shifted dual-parallel composite device to eliminate parasitics.

B. Technical Solution: Derivative Cancellation to Reduce Bias Sensitivity and Enhance Linearity Performance in N-Polar GaN MISHEMTs In the derivative cancellation technique two devices are biased at different gate voltages and the gate widths scaled such that the $g_{m3}$ of the two-devices is equal and opposite [9]. As shown in FIG. 5, the drain currents are combined in parallel, leading to a combined drain current with $g_{m3}$=0. This method becomes more challenging at higher frequency as there is a need to bias two cells and combine them with minimal parasitics—and these parasitics become quite important especially as $2^{nd}$ harmonic currents generate harmonic voltages of $j·2\omega·L_{parasitic}$ across any parasitic inductance which can lead to $3^{rd}$ order mixing products. Hence a low inductance layout is preferred to maximize performance.

a. Novel Incorporation of Derivative Cancellation into the Device

The present invention integrates derivative cancellation directly into the device—by adjusting the threshold voltage in a castellated matter across the entire gate finger. This concept is illustrated in FIG. 6 in a three-dimensional view, and FIG. 8 in a cross-section and plan view. In these figures, a device is presented in a specific incarnation based on a N-polar HEMT. This invention can be extended for more than two threshold regions. To assist in the manufacturability, etch stop layers may be included to establish the different threshold voltage values.

The epitaxy is grown with two AlGaN cap layers instead of one, and two recess etches are performed, so that when gate metal is evaporated two different threshold voltages ($V_{T,A}$, and $V_{T,B}$) may be obtained. The AlGaN forms a precision epitaxially-defined etch stop—so this linearizes the device at the epi level. The etch depth is varied in a castellated pattern across the gate finger with a period ~1 µm, so that the current combines immediately in the ohmic region with essentially zero parasitic inductance. The lack of interconnect parasitic can only be obtained with a device-level approach, which also gives confidence that the technique will be applicable to frequencies far greater than 30 GHz.

Figure 7:
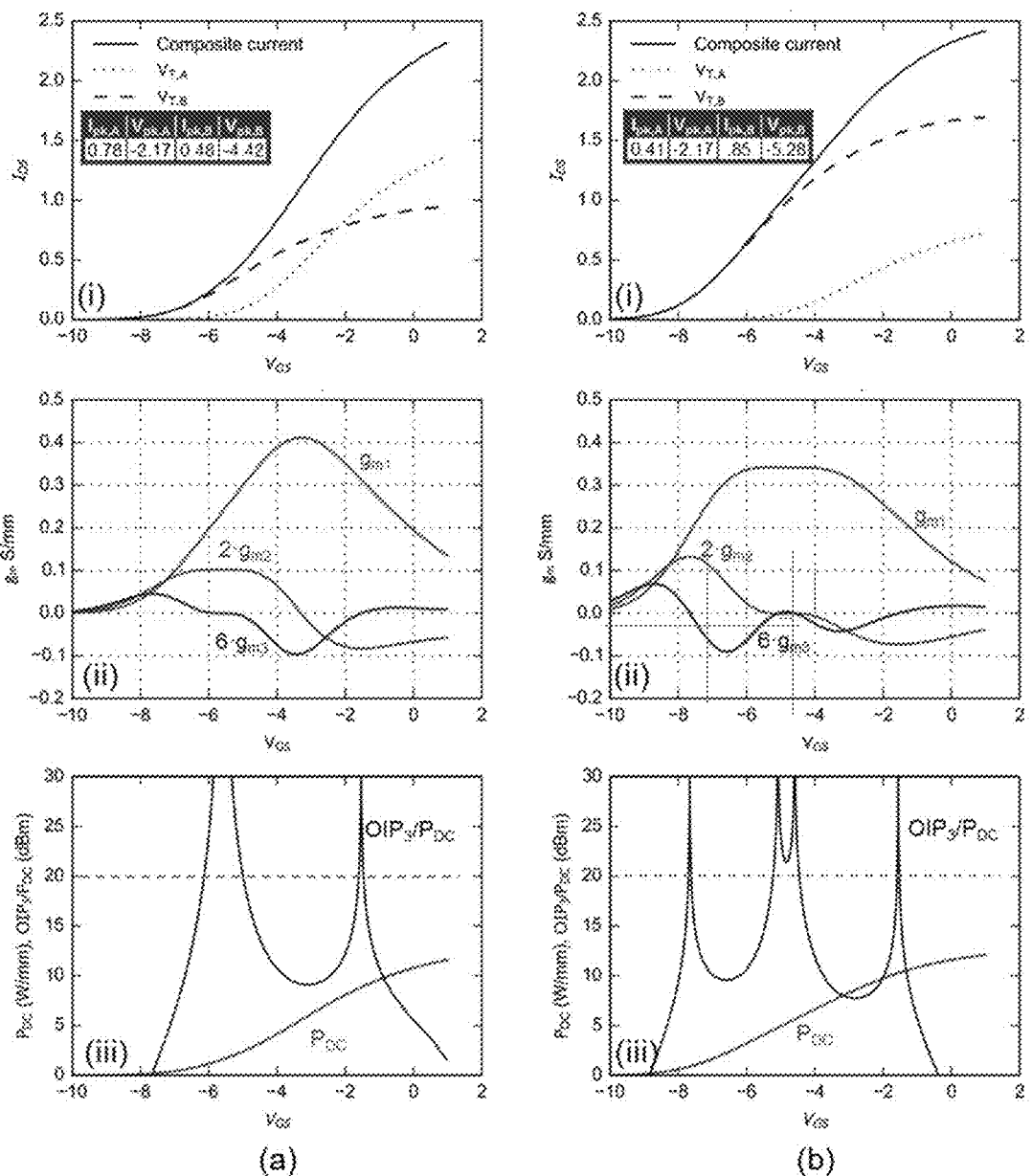

The portion of the gate which is placed at the upper of the two AlGaN etch stops will have a more negative threshold voltage, and thus a more negative $V_{pk}$. This is modeled here using an Angelov-based model where the drain-source current dependence on gate-source voltage, $I_{DS}(V_{GS})$ is given by $I_{pk}(1+\tan h(p_1(V_{GS}-V_{PK})+p_2(V_{GS}-V_{pk})+p_3(V_{GS}-V_{PK})^3)))$. The $V_T$ of the device is controlled by $V_{PK}$ in the model. The percent of total gate width occupied by each threshold voltage is varied so that the derivative peaks are equal and opposite, and this is controlled by the $I_{pk}$ in the model. This is shown in FIG. 7 (a) for cancellation of the $g_{m3}$. The cancellation is effective, and leads to a wide and deep null of $g_{m3}$ with OIP3/$P_{DC}$ ratio above 20 dB over a range of 1.1 V in gate bias. In addition, the $g_{m2}$ peak is also problematic especially for LNA applications where a source inductance may be desired to achieve simultaneous noise and gain match at the device input. The source inductance creates a feedback path from the $2^{nd}$ harmonic current back to Vos, and can thus generate $3^{rd}$ order mixing products. The $g_{m2}$ is also a problem for direct conversion architectures where OIP2 is a concern.

b. Second Derivative Cancellation

Embodiments of the present invention uses an additional approach: $2^{nd}$ derivative ($g_{m2}$) cancellation (FIG. 7b). By cancelling $g_{m2}$, the $g_{m3}$ is also greatly reduced since $$g_{m3} = \frac{1}{3}\frac{dg_{m2}}{dV_{GS}}.$$

It is seen that this effectively linearizes the drain current and creates a flat $g_{m1}$ over a wide range. Another benefit is that, because $g_{m1}$ is greater at the $g_{m2}$ peak and minimum than it is at the $g_{m3}$ peak and minima, there is a smaller tradeoff in gain against the standard (no derivative cancellation) device. The OIP3/$P_{DC}$ ratio is above 20 dB for 0.8V of gate bias. It does not increase OIP3/$P_{DC}$ as much as direct $3^{rd}$ derivative cancellation. But it is a more robust technique as it actually linearizes the current and thus avoids the aforementioned $g_{m2}$ problem, and therefore it is our primary approach.

The gate capacitance nonlinearity will also be affected in this parallel derivative cancellation device. It is not of as significant concern as the transconductance nonlinearity, because $f_T$ of the device is high (>130 GHz), so the resulting nonlinear input currents will be small. However, its effect on nonlinearity would become increasingly dominant as other sources of nonlinearity are eliminated, so it must be considered. Therefore, we have extracted $C_{GS}(V_{GS})$ for $V_{DS}=6V$ from a N-polar deep-recess HEMT. We note that Cos has an apparent roll off after its peak as Vos increases towards 0V, which has been observed in some Ga-polar GaN devices as well. The origin of this is currently attributed to the same source resistance degeneration which influences the $g_m$ roll off. The shape and hence derivatives of $g_m$ and $c_{gs}$ are overall quite similar so flattening $g_m$ via derivative cancellation will similarly help linearize the $c_{gs}$.

Modifying Derivatives of Gate Capacitance

Figures 8A, 8B, 8C:
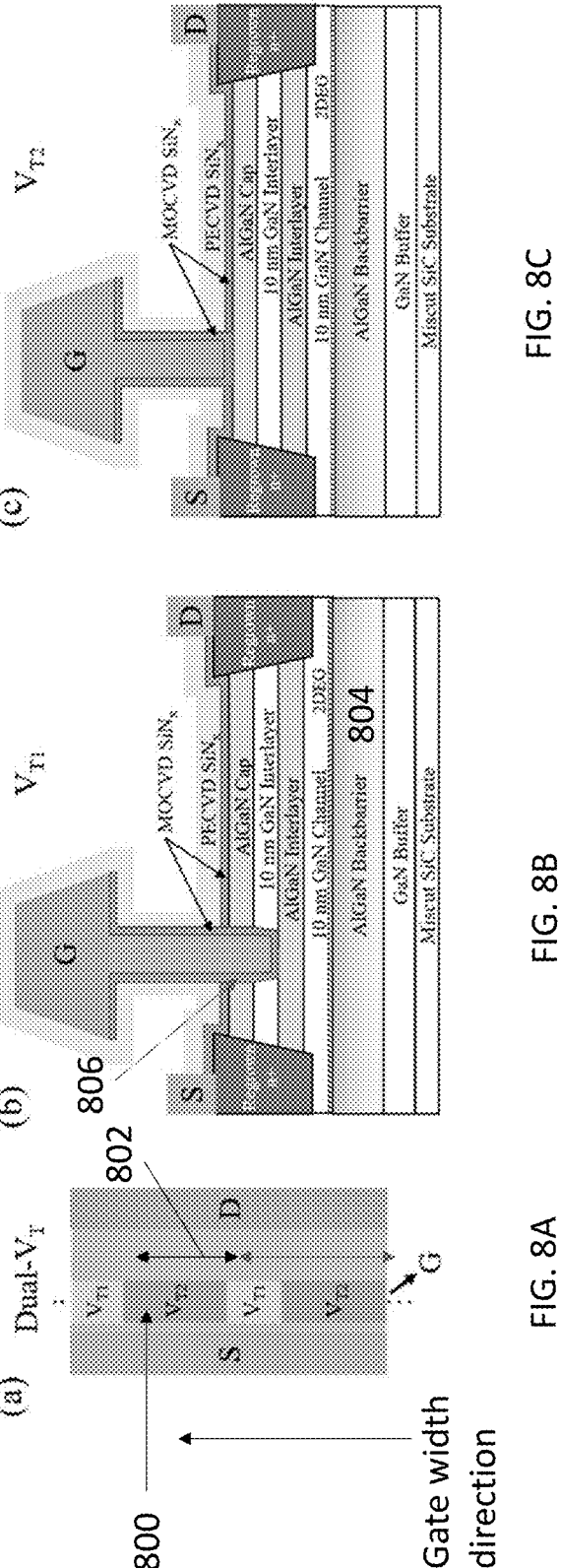
FIG. 8A illustrates an example of an entire gate width or a section of a gate width that can be periodically repeated or continued with varying width of the sections of $V_{T1}$ and $V_{T2}$. The first section or last section of the gate width can be $V_{T1}$ or $V_{T2}$.
Figure 8D:
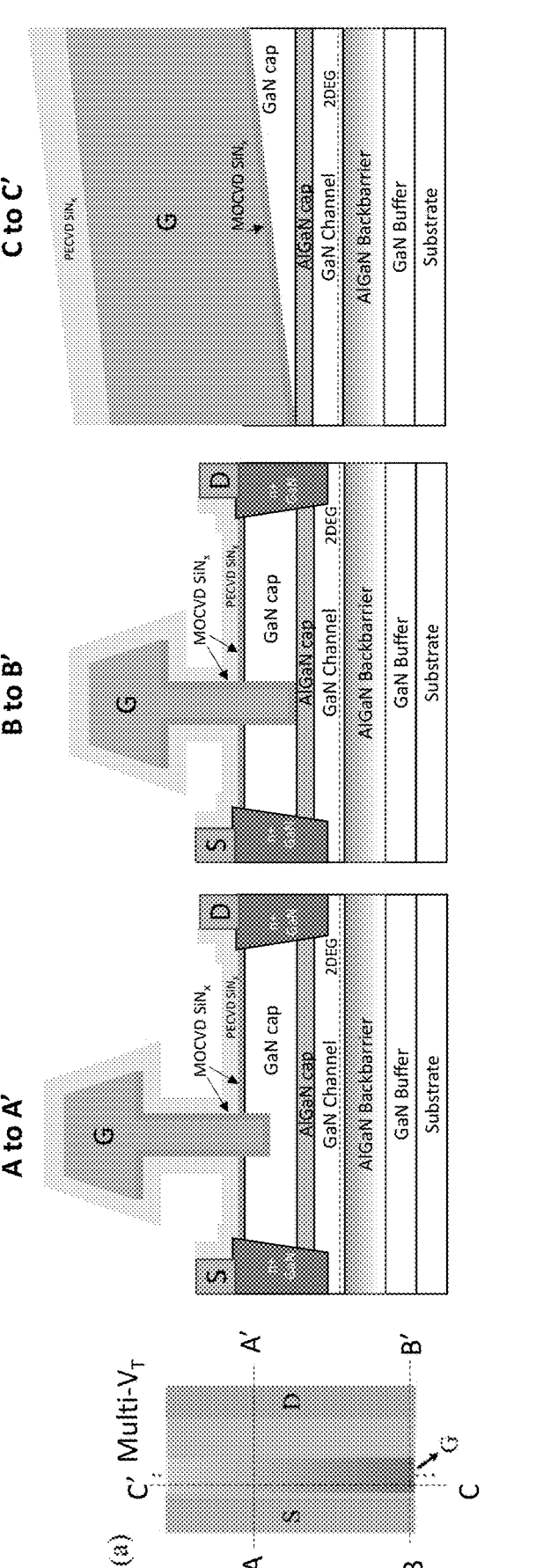
FIG. 8D illustrates further example device structures.

The structure may also be expanded upon to modify the derivatives of the gate capacitance independently of the derivatives in output current. This is shown in FIG. 8 (d). In this technique a portion of the gated region is electrically isolated from either the source or drain, which may be realized through ion implantation or mesa etching. If the drain region is disconnected through isolation then what remains is only a gate-source capacitance which has a nonlinear dependence on gate-source voltage, therefore $C_{GS}$ ($V_{GS}$). If the source region is disconnected through isolation then what remains is only gate-drain capacitance with a nonlinear dependence on the gate-drain voltage, therefore $C_{GD}(V_{GD})$. In these regions the threshold voltage will be either $V_{T1}$ or $V_{T2}$ which will allow modification of the total device $C_{GS}(V_{GS})$ and $C_{GD}(V_{GD})$ relationship. Further, due to lack of a drain-source voltage in these regions, all of the charge images either totally on the source or totally on the drain, which increases the capacitance and changes its dependence on the terminal voltages compared to the regions of the device where both the source and the drain are electrically connected. These provide additional degrees of freedom to change the gate capacitance to gate voltage relationship and modify their effect on distortion. This approach may be used to directly cancel derivatives in the gate capacitance relationship, or possibly to generate beneficial nonlinearities which cancels out possible remaining linearities in the device output current relationship. The drawback of this approach is that it necessarily increases the total gate capacitance without increasing the transconductance, which reduces the gain.

Experimental Data on Parallel Derivative Cancellation and Optimization

Figure 9:
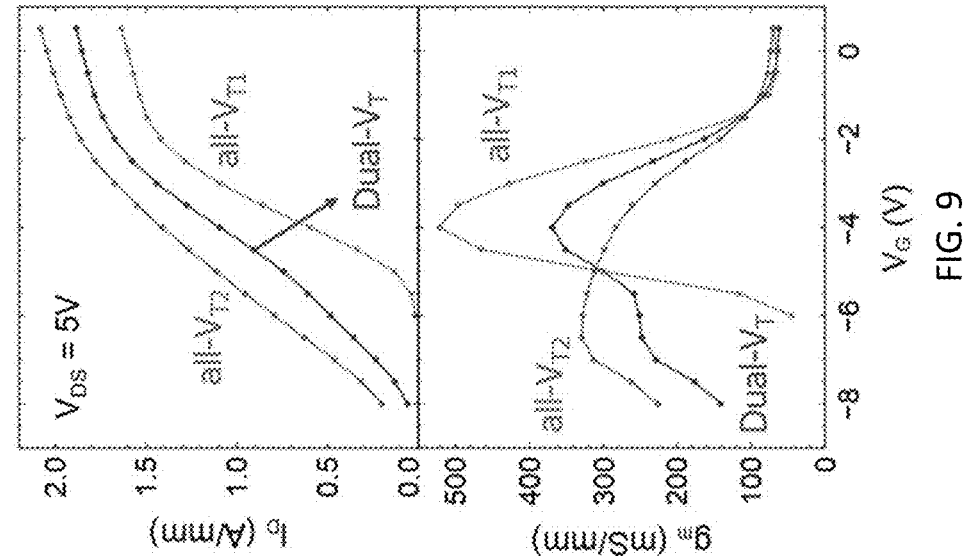
FIG. 9. A comparison of the various threshold voltage devices.
Figure 10:
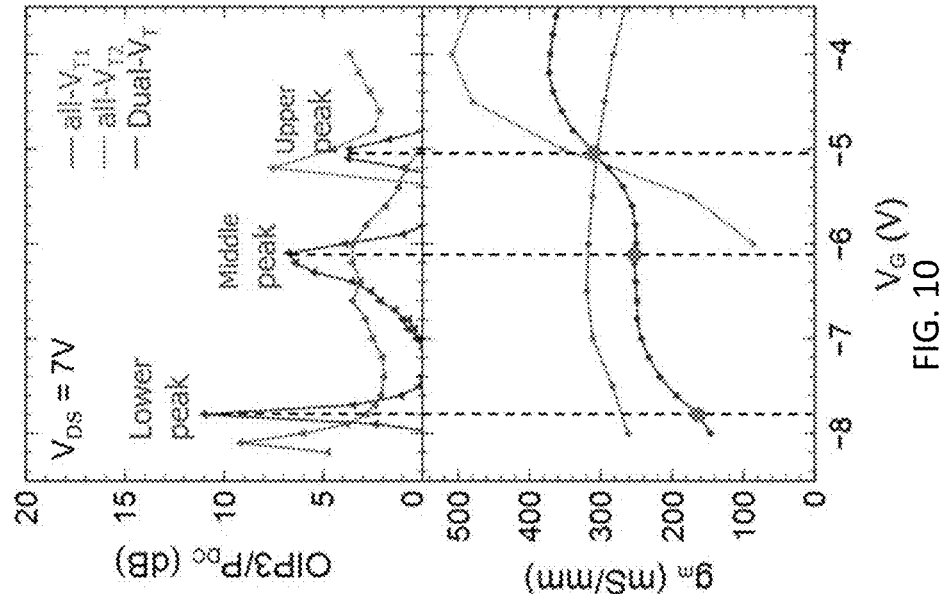
FIG. 10. Two-tone load-pull input-bias sweep at 30 GHz with a tone spacing of 1 MHz. The dual-VT device exhibits three distinct OIP3/$P_{DC}$ peaks, consistent with the $g_m$ profile.
Figure 11:
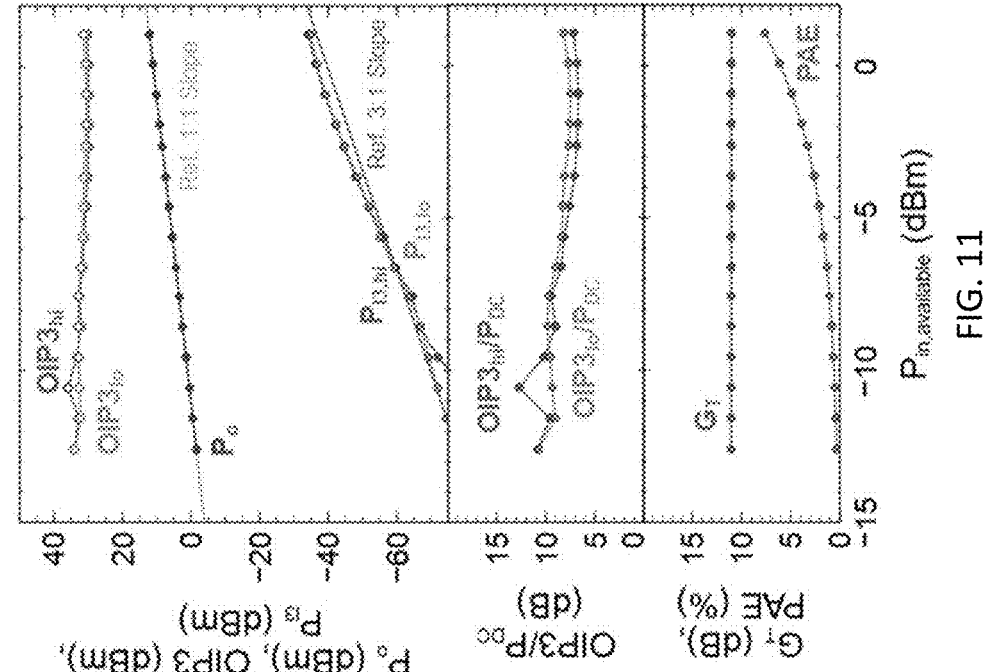
FIG. 11. Linearity performance of the dual threshold device.

FIG. 9 shows the transfer characteristics of three devices: (i) single threshold all-$V_{T1}$ (green curve), (ii) single threshold all-$V_{T2}$ (blue curve), (iii) dual-threshold (dual-$V_T$) comprising of segments of $V_{T1}$ and $V_{T2}$ (red curve). The threshold voltage difference between all-$V_{T1}$ and all-$V_{T2}$ ($\Delta V_T$) is 3.25V. The quality of the transconductance ($g_m$) curve in FIG. 9 (b) shows that the dual-$V_T$ device is a parallel combination of $V_{T1}$ and $V_{T2}$. The two-tone load-pull measurements at 30 GHz with a tone spacing of 1 MHz is taken with a vector receiver load-pull system. FIG. 10 (a) shows OIP3/$P_{DC}$ versus input-bias, measured at constant source and load impedance ($\Gamma_S$, $\Gamma_L$) to compare the three devices. This input-bias sweep is consistent with the $g_m$ profiles (FIG. 10 (b)). Generally all transistors exhibit a sharp, narrow peak in OIP3/$P_{DC}$ at the $g_{m3}$ zero-crossing point, where the device is turning on. In FIG. 10 (a), we observe three distinct OIP3/$P_{DC}$ peaks in the dual-$V_T$ device (red curve): (i) the lower peak occurs where all-$V_{T2}$ device is turning on, (ii) the middle peak occurs in the region where the falling $g_m$ of $V_{T2}$ is compensated by the rising $g_m$ of $V_{T1}$, resulting in a flat $g_m$ region in the dual-$V_T$ device, (iii) the upper peak occurs where all-$V_{T1}$ device is turning on. At even higher VG a $4^{th}$ peak would exist corresponding to the falling $g_m$. Our results show that $\Delta V_T$ is too large. We can achieve high linearity over a broader input-bias range by reducing $\Delta V_T$ (designing threshold voltage $V_{T2}$ to be less negative) so that there is a good overlap between the middle and upper peaks (as shown by simulation in FIG. 13). FIG. 11 shows the two-tone input-power sweep of the dual-$V_T$ device, measured at the middle OIP3/$P_{DC}$ peak. We report 10.8 dB OIP3/$P_{DC}$, 34 dBm OIP3 and 11 dB gain at 463 mA/mm and $V_{DS}$ of 9V at 30 GHz. This demonstrates that parallel-derivative-cancellation device technology based on N-polar GaN MIS-HEMT is realizable. An optimally designed dual-$V_T$ device is prom-
ising for achieving high linearity over a wide range of
input-bias.

Figure 12:
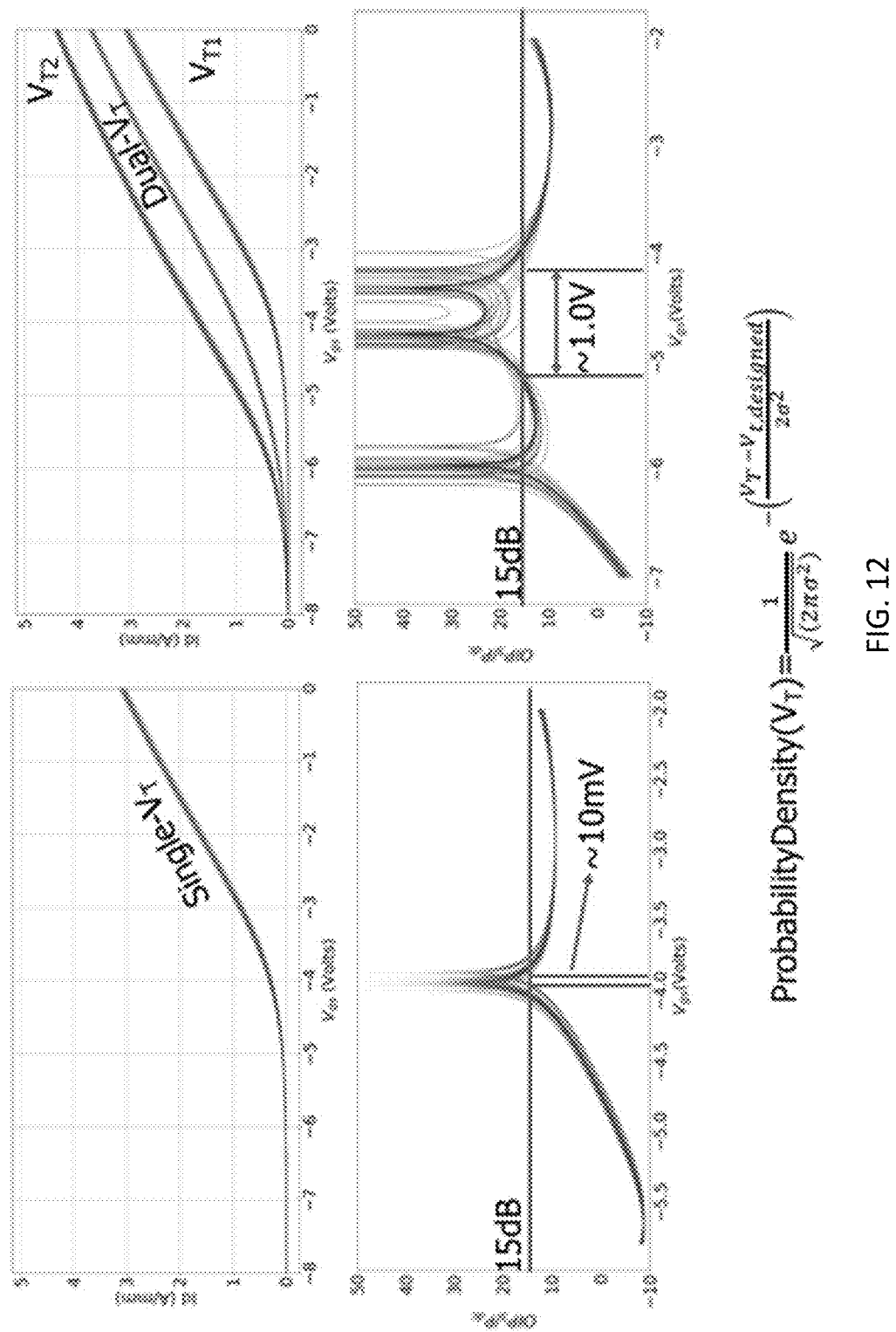
FIG. 12. Impact of process variation leading to a distribution of $V_T$. In the single $V_T$ device (left plots) a 10 mV range is available to realize OIP3/$P_{DC}$ above 10 dB whereas in the dual $V_T$ device (right plots) a 1 V range is available.
Figure 13:
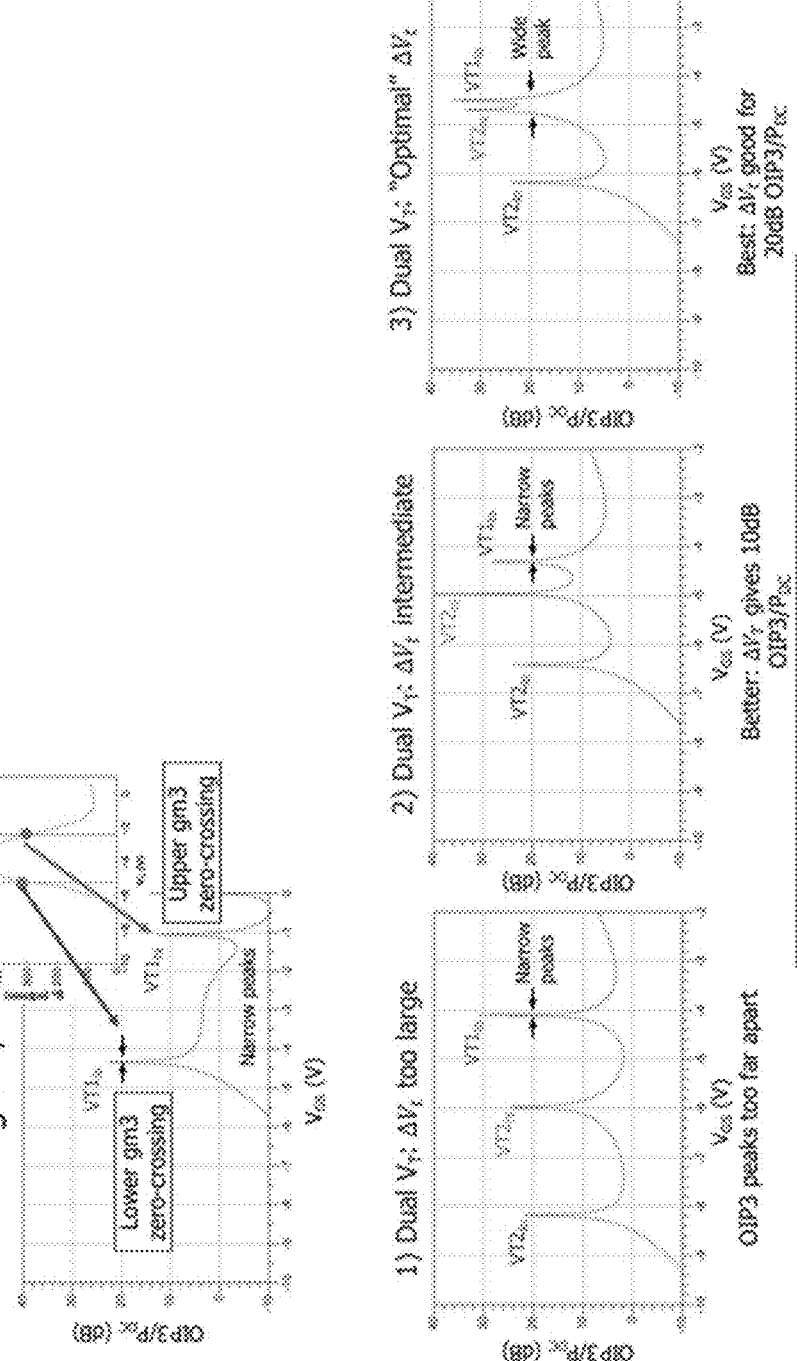
FIG. 13. Simulation of the impact of the magnitude of $\Delta V_T$ on the realization of a derivative cancellation device. In case (1) $\Delta V_T$ is too large resulting in independent peaks. In case (2) some improvement is realized between the VT2$_{hi}$ and VT1$_{lo}$ peak with an intermediate $\Delta V_T$, however the highest peaks are still very narrow in bias. In case (3) and optimal $\Delta V_T$ exists where a high OIP3/$P_{DC}$ exists over a wide bias range resulting from good overlap of the VT2$_{hi}$ and VT1$_{lo}$ peaks.

FIG. 12 shows the enhanced bias window available to
achieve linear performance in a multiple threshold device (in
this case a dual threshold device) compared to a single
threshold device and FIG. 13 shows that the benefit in using
the correct threshold difference in achieving optimal linear-
ity performance. FIG. 12 further shows the effect of random
process variation $\sigma_{VT}$=50 mV for single and dual threshold
$V_T$ devices.

FIG. 13 shows single threshold voltage devices have very
narrow OIP3 peaks at $g_{m3}$ crossings and high $g_{m2}$ and OIP3
peak implying poor OIP2, and that dual threshold $V_T$ devices
according to embodiments described herein enable deriva-
tive cancelation linearizing the device over a wider range,
with wide and high OIP3 peak and the potential for a high
OIP2 peak as well. In various examples, the dual $V_T$ device
must use appropriate differences in threshold voltage $\Delta V_T$.

Advantages and Improvements

It is important to enhance the linearity of transistors in
communications systems. In particular third-order non-lin-
earities result in in-band distortion and are therefore par-
ticularly important to control as they are difficult to filter out.
Reducing the non-linearity of a transistor can directly sim-
plify system level complexities, such as by removing the
need for digital pre-distortion.

Derivative cancellation techniques have been previously
demonstrated by utilizing multiple, separate devices. How-
ever those techniques do not scale up to mm-wave frequen-
cies in part due to parasitic inductance associated with
combining the devices. In this invention a device is
described which allows for derivative cancellation to occur
within a single device allowing for derivative cancellation to
be realized at mm-wave frequencies.

Derivative cancellation has also been previously demon-
strated using multi-threshold transistors using Ga-polar GaN
HEMT structures such as [2] where different threshold
voltages were obtained by recessing through the top wide
bandgap III-nitride barrier. In that approach the planar
charge density of the 2DEG channel underneath the barrier
layer at zero gate to source voltage is highly sensitive to the
remaining thickness of the barrier, which leads to significant
variation of the 2DEG density across the width of the device,
and also can lead to some portions of the channel underneath
the gate having low 2DEG density (below $9 \cdot 10^{12}$ cm$^{-2}$)
which can reduce performance. Surprisingly and unexpect-
edly, embodiments of the present invention use method
which allows for much reduced variation in the 2DEG
charge density along the gate width, as the threshold voltage
variation is obtained primarily through variations in the gate
capacitance; further, embodiments of the present invention
also allow for high charge density at zero gate to source
voltage along all portions of the channel underneath the gate.

Device and Method Embodiments

Figure 6A:
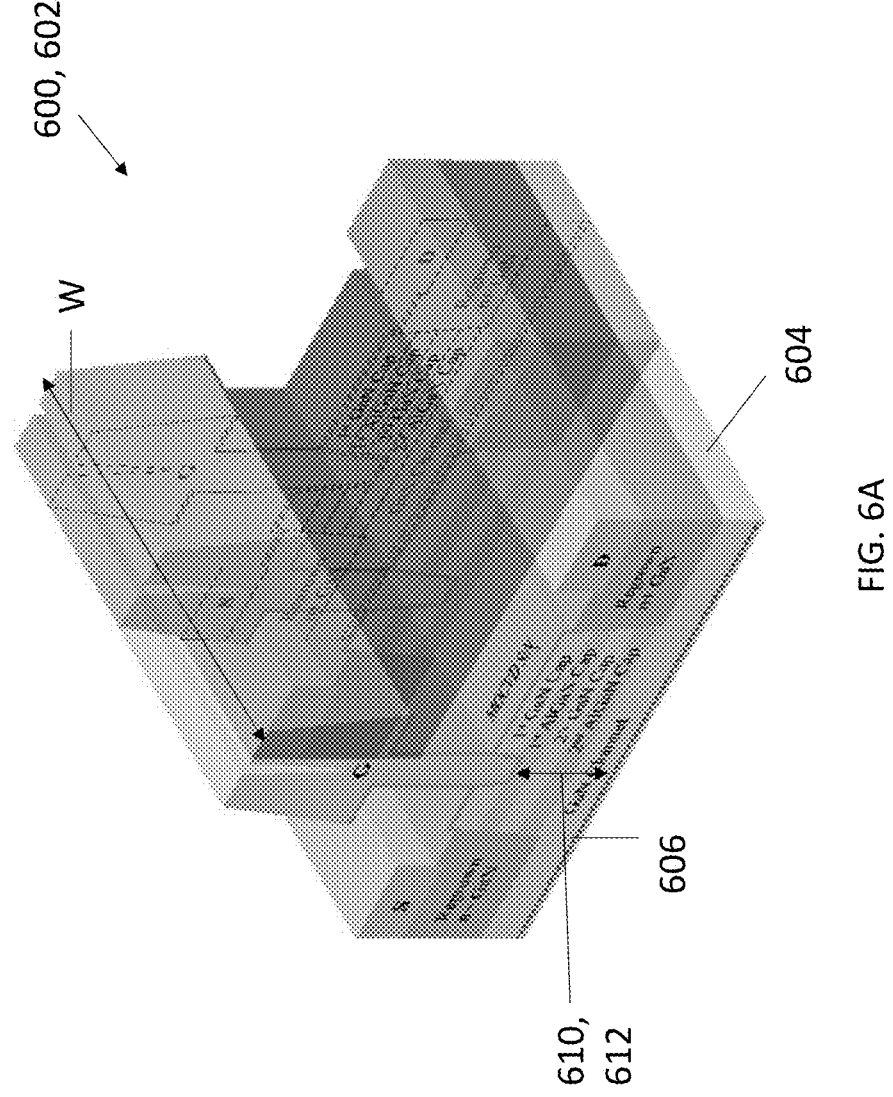
FIG. 6A-6B. Schematics of N-polar deep recess HEMTs for high linearity with parallel derivative cancellation technique using current HEMT structure with selective etch stopped on different AlGaN cap layer.
Figure 6B:
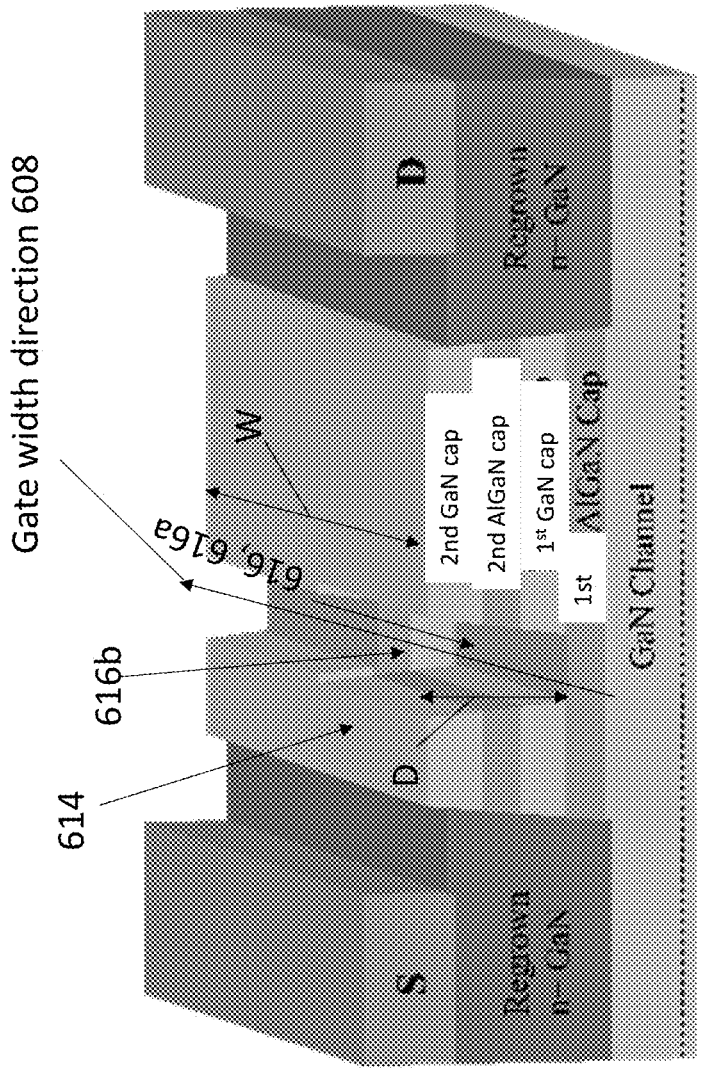

Example embodiments of the present invention include,
but are not limited to, the following (referring also to the
figures):

1. FIGS. 6A and 6B illustrate an embodiment of a device
600, comprising:
a transistor 602 structure comprising:
a source(S);
a drain (D);
a channel 604 comprising a material;
a gate (G) modulating a flow of current comprising
mobile charge carriers 606 between the source and the drain, the gate having a gate width W having a com-
ponent 608 parallel to a direction perpendicular to the
flow; and
a thickness 610 comprising one or more materials
between the gate G and a centroid of the mobile charge
carriers, wherein at least 50% of the thickness is
comprised of the same material as the channel and the
thickness varies along the gate width so as to vary a
threshold voltage $V_{T1}$, $V_{T2}$ along the gate width.
2 The device of clause 1, wherein the same material is
defined as substantially similar, including (Al,In,Sc,
Ga)N or related materials where non-Ga components
are small (e.g. <5%), not introducing more than 5%
variation in 2DEG charge due to piezoelectric or dop-
ing effects relative to a GaN material
3. The device of clause 1 or 2, comprising at least one of:
FIG. 8 illustrates the thickness varying discretely in
sections 800 of the gate width so that each of a plurality
of portions of current flowing under a different one of
the sections experience a different discrete threshold
voltage and a longest one of the sections of a particular
threshold voltage has a length 802 no more than 0.1%
of a free space wavelength of a maximum operating
frequency of the transistor, so as to reduce a parasitic
inductance between the portions of current, or
the thickness varying continuously to continuously vary
the threshold voltage and a distance between repeated
threshold voltages is no more than 0.1% of the free
space wavelength so as to reduce the parasitic induc-
tance between the portions of current.
4. For example, in the device of clause 3, for operating
frequency of 10 GHz, 0.1% of the free space wave-
length corresponds to the length of 30 micrometers, for
the operating frequency of 30 GHz, 0.1% of the free
space wavelength corresponds to the length of 10
micrometers, and for the operating frequency of 94
GHZ, 0.1% of the free space wavelength corresponds
to the length of 3.2 micrometers.
5. The device of any of the clauses 1-4, wherein:
the transistor has at least one of $g_{m2}$ and $g_{m3}$ tailored by
a variation in the threshold voltage across the gate
width;
the thickness has two values, thereby setting two thresh-
old voltages, which are selected in such a way that at
least (as illustrated in FIG. 5):
the $g_{m2}$ associated with each of the threshold voltages
have opposite signs and magnitudes equal to within
50% over a range in gate voltages applied to the gate
with respect to the channel,
the $g_{m3}$ associated with each of the threshold voltages
have opposite signs and magnitudes equal to within
50% over the range in gate voltages,
such that a summing of portions of the current in indi-
vidual sections of the gate width experiencing the
different ones of the two threshold voltages reduces the
magnitude of at least one of $g_{m2}$ Or $g_{m3}$ over the range
in the gate voltages relative to a constituent single-
threshold voltage transistor having only one of the two
threshold voltages.
6. The device of any of the clauses 1-4, wherein:
the transistor has at least one of $g_{m2}$ and $g_{m3}$ tailored by
a variation in the threshold voltage;
the thickness varies with more than two values, varies in
a continuous fashion across the gate width, or has a
combination of discrete and continuously varying val-
ues, so as to set a plurality of threshold voltages, such
that a summing of portions of the current, flowing in individual sections of the gate width experiencing different ones of the threshold voltages, reduces a magnitude of $g_{m2}$ Or $g_{m3}$ over a range in gate voltage, relative to a constituent single-threshold voltage transistor comprising only one of the threshold voltages.

7. The device of any of the clauses 1-6, wherein:

the materials and a total separation between the gate and the centroid lead to a planar mobile carrier charge density underneath the gate at zero gate to source voltage which varies by no more than 20% across an active width of the gate;

the mobile carrier charge density has a minimum value of $0.9 \cdot 10^{13}$ cm$^{-2}$ assessed in any segment 50 nanometers or wider across the active width of the gate; and the active width of the gate includes portions of the gate which are above a conducting channel comprising the mobile charge carriers, and does not include edge regions where isolation processes may alter channel charge densities.

8. FIG. 6A, 6B, FIG. 8B illustrate an embodiment of a transistor 602, comprising:

a channel 604 comprising a III-nitride material comprising a crystal having a surface comprising a Nitrogen-polar plane of the crystal, or a plane within 10 degrees of the Nitrogen-polar plane;

a source contact S and a drain contact D to the channel;

a III-nitride backbarrier 804 confining mobile charge carriers 606 in the channel;

a III-nitride cap 614, wherein the channel is between the cap and the backbarrier;

a recess 616 or opening in the cap;

a gate G in the recess, the gate controlling a flow of current between the source contact and the drain contact and the gate having a gate width W having a component 608 parallel to a direction perpendicular to the flow;

and wherein:

the gate is closer to the Nitrogen-polar plane or the plane within 10 degrees of the Nitrogen-polar plane, as compared to a metal-polar plane of the crystal; and the recess 616 comprises a depth D varying along the gate width W so that the transistor 602 has at least two threshold voltages $V_{T1}$, $V_{T2}$ varying along the gate width.

9. The transistor of clause 8 or any of the clauses 1-7 wherein the recess 616 at least:

extends into the channel across at least a portion of the gate width, or includes an electrically insulating material (806 in FIG. 8B) deposited on a base, sidewalls, or the base and sidewalls of the recess.

10. The transistor of any of the clauses 1-7, clause 8, or 9 wherein at least 50% of a thickness 610 between the gate G and a centroid of the mobile charge carriers, including the cap and the channel, consists essentially of the III-nitride material of the channel across an entirety of the gate width.

11. The transistor of any of the 1-10 wherein a plurality of distances 612 between the gate and the centroid of the mobile charge carriers 606 in the channel 604 tailor a linearity or nonlinearity of the device.

12. The transistor of any of the clauses 1-11, wherein:

the III-nitride material of the channel 604 comprises one or more layers of $Sc_vGa_wAl_xIn_yB_zN$ where $0 \le v \le 1$, $0 \le w \le 1$, $0 \le x \le 1$, $0 \le y \le 1$, $0 \le z \le 1$, and $v+w+x+y+z=1$ and at least 50% of a thickness between the gate and the centroid of the mobile charge carriers comprises one or more layers of the $Sc_vGa_wAl_xIn_yB_zN$ wherein the x, y, z, v, w do not vary by more than 5% as compared to in the channel, or the channel 604 comprises a composition including Gallium and Nitrogen, and at least 50% of the thickness consists essentially of the composition or GaN.

13. FIG. 6B illustrates the transistor of any of the clauses 1-12 wherein the cap comprises a plurality of layers, including at least two etch stop layers ($1^{st}$ and $2^{nd}$ AlGaN cap in FIG. 6B), wherein the etch stop layers are used to control the depths D defining a distance 612 between the gate and a centroid of the mobile charge carriers.

14. The transistor of any of the clauses 1-13 wherein distances 612 between the gate and the centroid of mobile charge carriers form different sections 800 along the gate width that experience different threshold voltages, and the distances are selected such that a summing of portions of the current in the different sections of the gate width reduces a magnitude of at least one of $g_{m2}$ Or $g_{m3}$ over a range in gate voltage relative to a constituent single-threshold voltage transistor having only one of the threshold voltages.

13. The transistor of any of the clauses 1-12, wherein:

the channel 604 comprises GaN comprising a two dimensional electron gas or a two dimensional hole gas confined in the channel by the barrier;

the cap comprises a cap structure on the channel and the cap structure comprises (see FIG. 6B):

a first aluminum containing nitride layer (e.g., $1^{st}$ AlGaN cap) on or above the channel;

a first GaN layer (e.g., $1^{st}$ GaN cap) on or above the first aluminum containing nitride layer;

a second aluminum containing nitride layer (e.g., second AlGaN cap) on or above the first GaN layer;

a second GaN layer (e.g., second GaN cap) on or above the second aluminum containing nitride layer, the first and second aluminum containing nitride layers are etch stop layers, a first region 616a of the recess extends through the second GaN layer and the first GaN layer so that only a portion of the first aluminum containing nitride layer is between the channel and a base of the gate, or the recess extends all the way through the first aluminum containing nitride layer, and a second region 616b of the recess extends through second GaN layer and at least a portion of the second aluminum containing nitride layer, so that the first aluminum containing nitride layer and at least a portion of the first GaN layer are between the channel and the base of the gate.

14. The transistor of any of the clauses 1-13, wherein (as illustrated in FIG. 6B):

the cap includes two or more aluminum containing nitride layers (e.g., AlGaN), the cap includes recess including two or more etched recesses, and the aluminum containing nitride cap layers form epitaxially-defined etch stops establishing the depths controlling the threshold voltages. In various examples, the cap includes alternating GaN and aluminum containing nitride layers.

15. The transistor of any of the clauses 1-14, wherein a percentage of the gate width occupied by each of the threshold voltages, and the depths of the recess, are such that a transconductance derivative local maximum for one or more of $g_{m2}$ Or $g_{m3}$, respectively, defined by one of the threshold voltages, are overlaid with a local derivative minimum of $g_{m2}$ or $g_{m3}$ respectively, defined by another of the threshold voltages, with a magnitude equal to within 50% so as to reduce a sum of at least the $g_{m2}$ or the $g_{m3}$, respectively, compared to that of a device having a recess comprising only the largest of the depths (see e.g., FIG. 5).

16. The transistor of any of the clauses 1-15 operating a frequency greater than 1 GHz.

17. The transistor of clause 8 including the features of any of the clauses 2-7.

Figure 14:
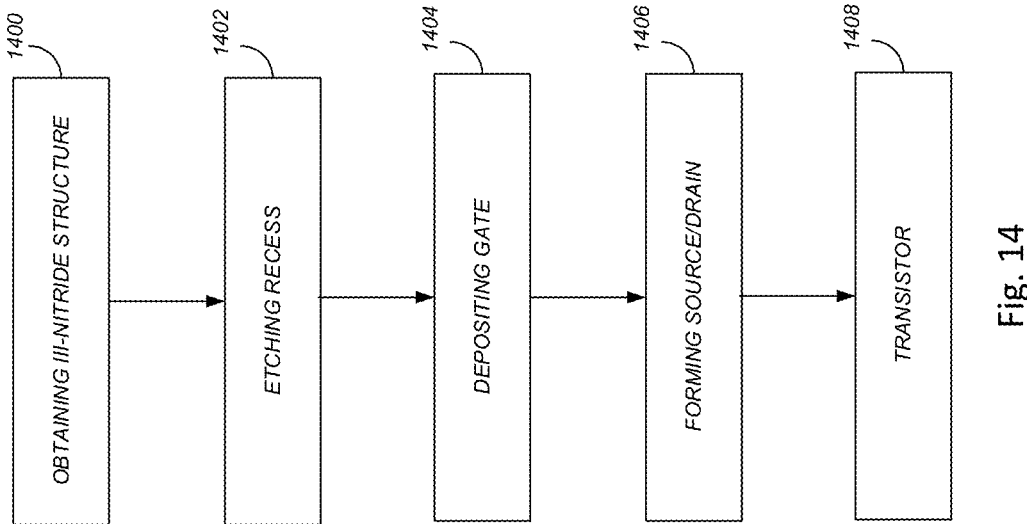
FIG. 14. Flowchart illustrating an example method of making a transistor.

18. FIG. 14 is a flowchart illustrating a method of making a transistor, comprising (see e.g., FIG. 6A, 6B, 8B):

obtaining (Block 1400) an N-polar III-Nitride structure comprising:

a III-nitride barrier layer on or above a substrate;

a III-nitride channel layer on the III-nitride barrier layer, wherein the barrier layer confines mobile charge carriers in the channel layer;

a III-nitride cap on the channel layer, wherein the III-nitride cap includes one or more etch stop layers separated by layers that etch at least 10 times faster than the etch stop layers;

etching (Block 1402) a recess having a depth profile in the III-nitride cap layer using lithographic patterning;

depositing (Block 1404) a gate in the recess so that the gate controls a flow of current between the source contact and the drain contact and the gate has a gate width having a component parallel to a direction perpendicular to the flow of the current;

forming (Block 1406) a source contact and a drain contact to the channel layer;

and wherein:

the lithographic patterning and a composition and positioning of the etch stop layers establish the depth profile varying along the gate width so that the transistor has at least two threshold voltages varying along the gate width; and so that a transistor is made (Block 1408)

19. The method of clause 18, wherein:

the channel layer comprises GaN and the mobile charge carriers comprise a two dimensional electron gas or a two dimensional hole gas;

the cap comprises:

a first one of the etch stop layers comprising a first nitride layer comprising aluminum on or above the channel;

a first GaN layer on or above the first nitride layer;

a second one of the etch stop layers comprising a second nitride layer comprising aluminum on or above the first GaN layer;

a second GaN layer on or above the second nitride layer, a first region of the recess extends through the second GaN layer, the second nitride layer, the first GaN layer, and the first nitride layer or so that only a portion of the first aluminum nitride layer is between the channel and a base of the gate, and a second region of the recess extends through second GaN layer and the second nitride layer, so that the first aluminum nitride layer and at least the first GaN layer is between the channel and the base of the gate.

19. The method of clause 18-19 including the features of any of the clauses 1-17.

20. The method of any of the clauses 18-20 using a hardmask formed with lithographic patterning, and two different hardmask materials are used (openings in the first hardmask defines where the recess is made, and the opening the second and first hardmask define where the deeper portion of the recess is formed).

21. The method of any of the clauses 18-20 wherein a gate insulator is deposited in the recess prior to depositing gate metal on the gate insulator.

22 A transistor manufactured using the method of any of the clauses 18-21.

23. The transistor of any of the clauses, wherein:

the materials and a total separation between the gate and the centroid lead to a planar mobile carrier charge density, of the mobile charge carriers underneath the gate at zero gate to source voltage, that at least:

varies by no more than 20% across an active width of the gate;

or, has a minimum value of $0.9 \cdot 10^{13}$ $cm^{-2}$ assessed in any segment 50 nanometers or wider across the active width of the gate; and the active width of the gate includes portions of the gate which are above a conducting channel comprising the mobile charge carriers, and does not include edge regions where isolation processes may alter channel charge densities.

Example Materials and Dimensions

The following examples can be used in any of the example clauses 1-22 above.

The channel material will typically be a semiconductor. Examples of such a material may include GaN, $In_xGa_{1-x}N$, $Al_xGa_{1-x}N$, Si, SiGe, GaAs, InAs, InSb, InAsSb, GaInAsSb. These materials may be used in various orientations, such as the N-polar orientation for III-nitride materials.

For implementations of the invention where the gate is closest to an N-polar crystal face (or within 10 degrees) of a III-nitride channel, an example implementation includes: a backbarrier made of graded and stepped $Al_xGa_{1-x}N$ with x reaching values as high as 1, a channel made of GaN, a cap consisting of alternating layers of $Al_xGa_{1-x}N$ and GaN where x is in a range of 0.1-0.5.

Electrically insulating materials may be used such as between the gate and a semiconductor. Examples of applicable insulating materials include silicon nitride, aluminum oxide, and silicon oxide, in various stoichiometric ratios. Additional impurities may be present in insulating materials. An example application of an insulator may have a single material which consists essentially of the same material throughout a thickness, or a stack of multiple insulating materials, or a material with a graded or stepped composition.

A gate has two main dimensions, a length which has a component parallel to the flow of current in a channel, and a width which has a component perpendicular to a flow of current. The length will vary based on aspects of the application, such as the maximum frequency of operation. Example length values for applications above 30 GHz could range from 5 nm to 250 nm. Example values for applications below 30 GHz could range from 50 nm to 1000 nm. The width will also vary based on the application, example ranges could range from 5 μm to 250 μm.

The thickness between the gate and the centroid of charge carriers in a channel may include multiple materials, such as additional channel material, components of the cap, and electrically insulating material. Examples of such thicknesses include values between 2 nm and 50 nm.

The distance between sections of the gate width having different threshold voltages may be minimized to reduce parasitic inductance between such sections. For sections with a discrete threshold voltage, example values of a width of a single section having a given threshold voltage could range from 10 nm to 50 μm. A given section may be repeated one or more times along the width of a gate. For implementations with continuously varying threshold voltage the threshold may vary periodically, examples of the distance between sections with the same threshold include values from 10 nm to 50 μm.

Nomenclature

The terms "III-nitride" as used herein (as well as the terms "Group-III nitride", or "III-N", or "nitride," used generally) refer to any alloy composition of the (Sc,Ga,Al,In,B)N semiconductors having the formula $Sc_vGa_wAl_xIn_yB_zN$ where $0 \leq v \leq 1$, $0 \leq w \leq 1$, $0 \leq x \leq 1$, $0 \leq y \leq 1$, $0 \leq z \leq 1$, and $v+w+x+y+z=1$. These terms are intended to be broadly construed to include respective nitrides of the single species, Sc, Ga, Al, In and B, as well as binary, ternary, quaternary and pentanary compositions of such Group III metal species. Accordingly, it will be appreciated that the discussion of the invention hereinafter in reference to GaN materials is applicable to the formation of various other (Sc,Ga,Al,In,B) N material species. Furthermore, (Sc,Ga,Al,In,B) N materials within the scope of the invention may include minor quantities of dopants and/or other impurity or inclusional materials. The term "non-III-nitride" or "non-III-N" refers to any semiconductor that is excluded from the definition provided for the term "III-nitride" or "III-N."

The term "N-polar" refers to the (000-1) plane of III-nitride materials.

The "threshold voltage" may be defined as the gate to source voltage necessary to turn on a transistor's channel, e.g. with a current greater than 1 milliamp per millimeter of gate width, or it may be defined as the x-intercept of a linear fit of the drain to source current versus gate to source voltage taken at the peak slope of the drain to source current.

The transconductance derivative are defined such that $g_{m2}$ is equal to $\frac{1}{2} \cdot d^2 I_{ds}/d^2 Vgs$ and $g_{m3}$ is equal to $\frac{1}{6} \cdot d^3 I_{ds}/d^3 Vgs$ where $I_{ds}$ is the drain to source current and $V_{gs}$ is the gate to source voltage.

REFERENCES

The following references are incorporated by reference herein

[1] Sameer Joglekar, Ujwal Radhakrishna, Daniel Piedra, Dimitri Antoniadis and Tomás Palacios, "Large Signal Linearity Enhancement of AlGaN/GaN High Electron Mobility Transistors by Device-level VT Engineering for Transconductance Compensation," in *IEEE International Electron Devices Meeting (IEDM)*, 2017.

[2] Minhan Mi, Sheng Wu, Meng Zhang, Ling Yang, Bin Hou, Ziyue Zhao, Lixin Guo, Xuefeng Zheng, Xiaohua Ma, and Yue Hao, "Improving the transconductance flatness of InAlN/GaN HEMT by modulating VT," *Applied Physics Express*, vol. 12, no. 11, 2019.

[3] Shahadat H. Sohel, Mohammad Wahidur Rahman, Andy Xie, Edward Beam, Yongjie Cui, Mark Kruzich, Hao Xue, Towhidur Razzak, Sanyam Bajaj, Yu Cao, Wu Lu, Siddharth Rajan, "Linearity Improvement with AlGaN Polarization-Graded Field Effect Transistors with Low Pressure Chemical Vapor Deposition Grown SiNx Passivation," *IEEE Electron Device Letters*.

[4] Jeong-sun Moon, Joel Wong, Bob Grabar, Mike Antcliffe, Peter Chen, Erdem Arkun, Isaac Khalaf, Andrea Corrion and Taylor Post, "Novel High-speed Linear GaN Technology with High Efficiency," in *IEEE MTT-S International Microwave Symposium (IMS)*, Boston, 2019.

[5] M. Guidry, B. Romanczyk, H. Li, E. Ahmadi, S. Wienecke, X. Zheng, S. Keller, U. K. Mishra, "Demonstration of 30 GHz OIP3/PDC>10 dB by mm-wave N-polar Deep Recess MISHEMTs," in 14*th European Microwave Integrated Circuits Conference (EuMIC)*, Paris, 2019.

[6] Stephen A. Maas AND Andrea Crosmun, "Modeling the Gate I/V Characteristic of a GaAs MESFET for Volterra-Series Analysis," *IEEE Trans. Microw. Theory Tech.*, vol. 37, no. 7, pp. 1134-1136, 1989.

[7] S. A. Maas, Nonlinear Microwave and RF Circuits, Artech House, 1997.

[8] Tian Fang, Ronghua Wang, Huili Xing, Siddharth Rajan, and Debdeep Jena, "Effect of Optical Phonon Scattering on the," *IEEE Electron Device Letters*, vol. 33, no. 5, pp. 709-711, 2012.

[9] Vladimir Aparin and Lawrence E. Larson, "Modified derivative superposition method for linearizing FET low-noise amplifiers," *IEEE Transactions on Microwave Theory and Techniques*, vol. 53, no. 2, pp. 571-581, 2005.

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

nn

What is claimed is:

1. A device, comprising:
   a transistor structure comprising:
   a source;
   a drain;
   a channel comprising a material;
   a gate modulating a flow of current comprising mobile charge carriers between the source and the drain, the gate having a gate width having a component parallel to a direction perpendicular to the flow; and
   a thickness comprising one or more materials between the gate and a centroid of the mobile charge carriers, wherein at least 50% of the thickness is comprised of the same material as the channel and the thickness varies along the gate width so as to vary a threshold voltage along the gate width.

2. The device of claim 1, comprising a transistor and at least one of:
   the thickness varying discretely in sections of the gate width so that each of a plurality of portions of current flowing under a different one of the sections experience a different discrete threshold voltage and a longest one of the sections of a particular threshold voltage has a length no more than 0.1% of a free space wavelength of a maximum operating frequency of the transistor, so as to reduce a parasitic inductance between the portions of current, or
   the thickness varying continuously to continuously vary the threshold voltage and a distance between repeated threshold voltages is no more than 0.1% of the free space wavelength so as to reduce the parasitic inductance between the portions of current.

3. The device of claim 1, comprising a transistor wherein:
   the transistor has at least one of $g_{m2}$ and $g_{m3}$ tailored by a variation in the threshold voltage across the gate width;

the thickness has two values, thereby setting two threshold voltages, which are selected in such a way that at least:

the $g_{m2}$ associated with each of the threshold voltages have opposite signs and magnitudes equal to within 50% over a range in gate voltages applied to the gate with respect to the channel, the $g_{m3}$ associated with each of the threshold voltages have opposite signs and magnitudes equal to within 50% over the range in gate voltages, such that a summing of portions of the current in individual sections of the gate width experiencing the different ones of the two threshold voltages reduces the magnitude of at least one of $g_{m2}$ Or $g_{m3}$ over the range in the gate voltages relative to a constituent single-threshold voltage transistor having only one of the two threshold voltages.

4. The device of claim 1, comprising a transistor wherein:

the transistor has at least one of $g_{m2}$ and $g_{m3}$ tailored by a variation in the threshold voltage; and the thickness varies with more than two values, varies in a continuous fashion across the gate width, or has a combination of discrete and continuously varying values, so as to set a plurality of threshold voltages, such that a summing of portions of the current, flowing in individual sections of the gate width experiencing different ones of the threshold voltages, reduces a magnitude of $g_{m2}$ Or $g_{m3}$ over a range in gate voltage, relative to a constituent single-threshold voltage transistor comprising only one of the threshold voltages.

5. The device of claim 1, wherein:

the materials and a total separation between the gate and the centroid lead to a planar mobile carrier charge density, of the mobile charge carriers underneath the gate at zero gate to source voltage, that at least:

varies by no more than 20% across an active width of the gate;

or, has a minimum value of $0.9 \cdot 10^{13}$ cm$^{-2}$ assessed in any segment 50 nanometers or wider across the active width of the gate; and the active width of the gate includes portions of the gate which are above a conducting channel comprising the mobile charge carriers, and does not include edge regions where isolation processes may alter channel charge densities.

6. A transistor, comprising:

a channel comprising a III-nitride material comprising a crystal having a surface comprising a Nitrogen-polar plane of the crystal, or a plane within 10 degrees of the Nitrogen-polar plane;

a source contact and a drain contact to the channel;

a III-nitride back barrier confining mobile charge carriers in the channel;

a III-nitride cap, wherein the channel is between the cap and the back barrier;

a recess or opening in the cap;

a gate in the recess, the gate controlling a flow of current between the source contact and the drain contact and the gate having a gate width having a component parallel to a direction perpendicular to the flow;

and wherein:

the gate is closer to the Nitrogen-polar plane or the plane within 10 degrees of the Nitrogen-polar plane, as compared to a metal-polar plane of the crystal; and the recess comprises a depth varying along the gate width so that the transistor has at least two threshold voltages varying along the gate width.

7. The transistor of claim 6 wherein the recess at least:

extends into the channel across at least a portion of the gate width, or includes an electrically insulating material deposited on a base, sidewalls, or the base and the sidewalls of the recess.

8. The transistor of claim 6 wherein at least 50% of a thickness between the gate and a centroid of the mobile charge carriers, including the cap and the channel, consists essentially of the III-nitride material of the channel across an entirety of the gate width.

9. The transistor of claim 6 wherein a plurality of distances between the gate and the centroid of the mobile charge carriers in the channel tailor a linearity or nonlinearity of the transistor.

10. The transistor of claim 6, wherein:

the III-nitride material comprises one or more layers of $Sc_vGa_wAl_xIn_yB_zN$ where $0 \leq v \leq 1$, $0 \leq w \leq 1$, $0 \leq x \leq 1$, $0 \leq y \leq 1$, $0 \leq z \leq 1$, and $v+w+x+y+z=1$ and at least 50% of a thickness between the gate and the centroid of the mobile charge carriers comprises one or more layers of the $Sc_vGa_wAl_xIn_yB_zN$ wherein the x, y, z, v, w do not vary by more than 5% as compared to in the channel, or the channel comprises a composition including Gallium and Nitrogen, and at least 50% of the thickness consists essentially of the composition or GaN.

11. The transistor of claim 6 wherein the cap comprises a plurality of layers, including at least two etch stop layers, wherein the etch stop layers are used to control the depths defining a distance between the gate and a centroid of the mobile charge carriers.

12. The transistor of claim 9 wherein distances between the gate and the centroid of mobile charge carriers form different sections along the gate width that experience different threshold voltages, and the distances are selected such that a summing of portions of the current in the different sections of the gate width reduces a magnitude of at least one of $g_{m2}$ or $g_{m3}$ over a range in gate voltage relative to a constituent single-threshold voltage transistor having only one of the threshold voltages.

13. The transistor of claim 6, wherein:

the channel comprises GaN comprising a two dimensional electron gas or a two dimensional hole gas confined in the channel by the back barrier;

the cap comprises a cap structure on the channel and the cap structure comprises:

a first aluminum containing nitride layer on or above the channel;

a first GaN layer on or above the first aluminum containing nitride layer;

a second aluminum containing nitride layer on or above the first GaN layer;

a second GaN layer on or above the second aluminum containing nitride layer, the first and second aluminum containing nitride layers are etch stop layers, a first region of the recess extends through the second GaN layer and the first GaN layer so that only a portion of the first aluminum containing nitride layer is between the channel and a base of the gate, or the recess extends all the way through the first aluminum containing nitride layer, and a second region of the recess extends through second GaN layer and at least a portion of the second aluminum containing nitride layer, so that the first aluminum containing nitride layer and at least a portion of the first GaN layer are between the channel and the base of the gate.

14. The transistor of claim 6, wherein:

the cap includes two or more aluminum containing nitride layers, the recess in the cap includes two or more etched recesses, and the aluminum containing nitride layers form epitaxially-defined etch stops establishing the depths controlling the threshold voltages.

15. The transistor of claim 14, wherein a percentage of the gate width occupied by each of the threshold voltages, and the depths of the recess, are such that a transconductance derivative local maximum for one or more of $g_{m2}$ of $g_{m3}$, respectively, defined by one of the threshold voltages, are overlaid with a local derivative minimum of $g_{m2}$ of $g_{m3}$ respectively, defined by another of the threshold voltages, with a magnitude equal to within 50% so as to reduce a sum of at least the $g_{m2}$ or the $g_{m3}$, respectively, compared to that of a device having a recess comprising only the largest of the depths.

16. The transistor of claim 6 operating a frequency greater than 1 GHz.

17. A method of making a transistor, comprising:

obtaining an N-polar III-Nitride structure comprising:

a III-nitride barrier layer on or above a substrate;

a III-nitride channel layer on the III-nitride barrier layer, wherein the barrier layer confines mobile charge carriers in the channel layer;

a III-nitride cap layer on the channel layer, wherein the III-nitride cap layer includes one or more etch stop layers separated by layers that etch at least 10 times faster than the etch stop layers;

etching a recess having a depth profile in the III-nitride cap layer using lithographic patterning;

forming a source contact and a drain contact to the channel layer;

depositing a gate in the recess so that the gate controls a flow of current between the source contact and the drain contact and the gate has a gate width having a component parallel to a direction perpendicular to the flow of the current; and wherein:

the lithographic patterning and a composition and positioning of the etch stop layers establish the depth profile varying along the gate width so that the transistor has at least two threshold voltages varying along the gate width.

18. The method of claim 17, wherein:

the channel layer comprises GaN and the mobile charge carriers comprise a two dimensional electron gas or a two dimensional hole gas;

the cap layer comprises:

a first one of the etch stop layers comprising a first nitride layer comprising aluminum on or above the channel layer;

a first GaN layer on or above the first nitride layer;

a second one of the etch stop layers comprising a second nitride layer comprising aluminum on or above the first GaN layer;

a second GaN layer on or above the second nitride layer, a first region of the recess extends through the second GaN layer, the second nitride layer, the first GaN layer, and the first nitride layer or so that only a portion of the first nitride layer is between the channel layer and a base of the gate, and a second region of the recess extends through second GaN layer and the second nitride layer, so that the first nitride layer and at least the first GaN layer is between the channel layer and the base of the gate.

\* \* \* \* \*